US009795020B2

(12) United States Patent
Shibayama et al.

(10) Patent No.: US 9,795,020 B2
(45) Date of Patent: Oct. 17, 2017

(54) ESD PROTECTION COMPONENT

(71) Applicant: TDK CORPORATION, Tokyo (JP)

(72) Inventors: Takeshi Shibayama, Tokyo (JP); Hidenobu Umeda, Tokyo (JP)

(73) Assignee: TDK CORPORATION, Tokyo (JP)

( * ) Notice: Subject to any disclaimer, the term of this patent is extended or adjusted under 35 U.S.C. 154(b) by 359 days.

(21) Appl. No.: 14/569,285

(22) Filed: Dec. 12, 2014

(65) Prior Publication Data

US 2015/0189727 A1 Jul. 2, 2015

(30) Foreign Application Priority Data

Dec. 26, 2013 (JP) ................................ 2013-269355

(51) Int. Cl.
*H05F 3/04* (2006.01)
*H05K 9/00* (2006.01)
*H01T 4/12* (2006.01)

(52) U.S. Cl.
CPC ................. *H05F 3/04* (2013.01); *H01T 4/12* (2013.01); *H05K 9/0067* (2013.01)

(58) Field of Classification Search
CPC .......... H02H 9/04; H02H 9/041; H02H 9/046; H01L 23/60; H01L 27/0248; H05F 3/04; H05K 9/0067
See application file for complete search history.

(56) References Cited

U.S. PATENT DOCUMENTS

| 8,724,284 B2 | 5/2014 | Umeda et al. | |
| 8,934,205 B2 * | 1/2015 | Asakura ................... | H01C 7/12 361/56 |
| 2012/0300355 A1 * | 11/2012 | Umeda ................ | H05K 9/0067 361/220 |
| 2014/0126102 A1 * | 5/2014 | Sumi ........................ | H01T 4/12 361/220 |
| 2014/0204499 A1 | 7/2014 | Umeda et al. | |
| 2016/0056627 A1 * | 2/2016 | Adachi ..................... | H01T 1/22 361/56 |

FOREIGN PATENT DOCUMENTS

| CN | 102802333 A | 11/2012 | |
| JP | 2001-143845 A | 5/2001 | |
| JP | WO 2012043576 A1 * | 4/2012 | ............... H01C 7/12 |
| JP | A-2012-248325 | 12/2012 | |
| KR | 20120132365 A | 12/2012 | |

* cited by examiner

*Primary Examiner* — Stephen W Jackson
*Assistant Examiner* — Christopher Clark
(74) *Attorney, Agent, or Firm* — Oliff PLC

(57) ABSTRACT

An ESD (ElectroStatic Discharge) protection component has: first and second discharge electrodes arranged so as to be opposed to each other through a gap; and a discharge inducing portion kept in contact with the first and second discharge electrodes and configured to connect the first and second discharge electrodes to each other. The discharge inducing portion has metal particles, a ceramic material containing glass, and a dielectric material having a dielectric constant higher than that of the ceramic material. A content of the dielectric material is in the range of 7.5 to 40% by volume, with respect to a total volume of the ceramic material and the dielectric material.

3 Claims, 18 Drawing Sheets

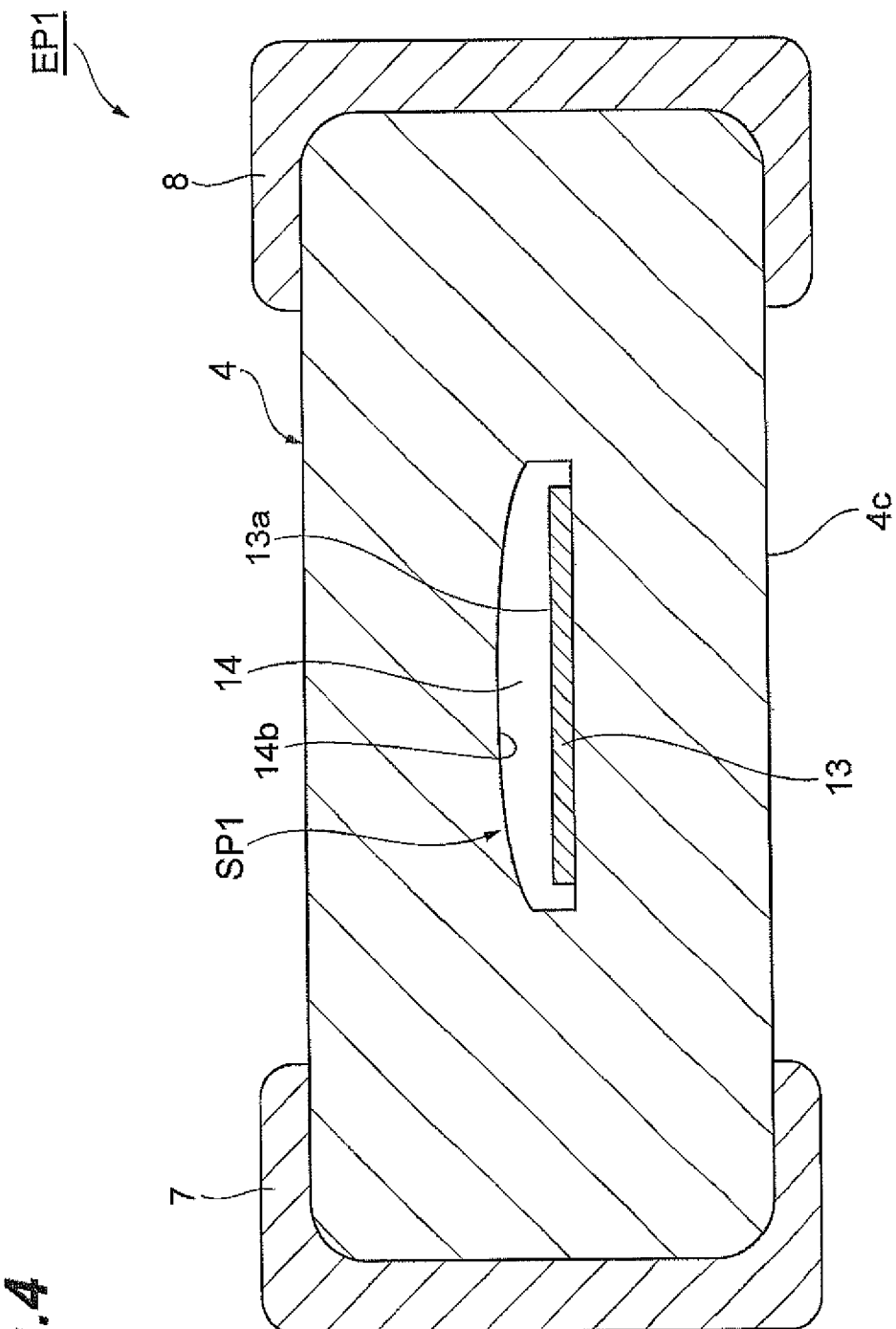

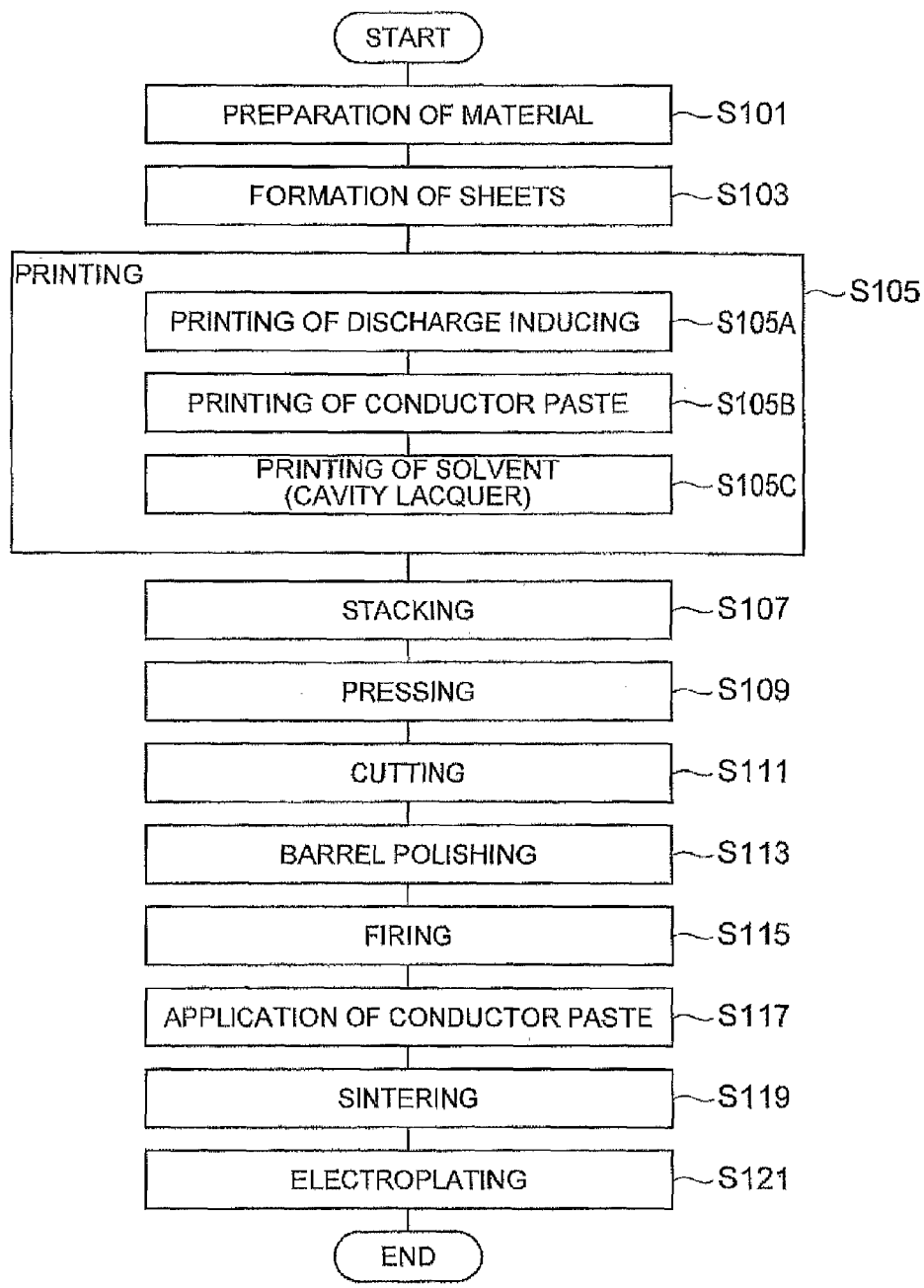

| DIELECTRIC CERAMIC COMPOSITION (vol%) | ZrO2 (vol%) | DISCHARGE START VOLTAGE (kV) |
|---|---|---|
| 100 | 0 | 4.5 |
| 95 | 5 | 2.04 |
| 92.5 | 7.5 | 1.56 |
| 85 | 15 | 1.24 |
| 80 | 20 | 0.84 |
| 70 | 30 | 1.44 |
| 60 | 40 | 1.24 |
| 50 | 50 | 2.13 |
| 40 | 60 | 3.56 |

| DIELECTRIC CERAMIC COMPOSITION (vol%) | ZrO2 (vol%) | DISCHARGE START VOLTAGE (kV) |
|---|---|---|
| 100 | 0 | 3.87 |
| 95 | 5 | 2.53 |
| 92.5 | 7.5 | 1.88 |
| 85 | 15 | 1.71 |
| 80 | 20 | 1.36 |
| 70 | 30 | 1.53 |
| 60 | 40 | 1.7 |
| 50 | 50 | 2.56 |
| 40 | 60 | 3.11 |

| DIELECTRIC CERAMIC COMPOSITION (vol%) | ZrO2 (vol%) | DISCHARGE START VOLTAGE (kV) |
|---|---|---|
| 100 | 0 | 4.5 |
| 95 | 5 | 3.5 |
| 92.5 | 7.5 | 2.4 |
| 85 | 15 | 1.8 |
| 80 | 20 | 1.7 |
| 70 | 30 | 1.56 |
| 60 | 40 | 1.69 |
| 50 | 50 | 1.8 |
| 40 | 60 | 2.1 |

| DIELECTRIC CERAMIC COMPOSITION (vol%) | ZrO2 (vol%) | DISCHARGE START VOLTAGE (kV) |
|---|---|---|
| 100 | 0 | 4.7 |
| 95 | 5 | 3.3 |
| 92.5 | 7.5 | 2.2 |
| 85 | 15 | 1.9 |
| 80 | 20 | 1.5 |
| 70 | 30 | 1.3 |
| 60 | 40 | 1.2 |
| 50 | 50 | 1.6 |
| 40 | 60 | 1.9 | ize
ESD PROTECTION COMPONENT

BACKGROUND OF THE INVENTION

Field of the Invention

The present invention relates to an ESD (ElectroStatic Discharge) protection component.

Related Background Art

There is a known ESD protection component provided with first and second discharge electrodes arranged so as to be opposed to each other through a gap and also provided with a discharge inducing portion kept in contact with the first and second discharge electrodes and configured to connect the first and second discharge electrodes to each other (e.g., cf. Japanese Patent Application Laid-open Publication No. 2012-248325).

SUMMARY OF THE INVENTION

An object of the present invention is to provide an ESD protection component a discharge start voltage of which can be set at a lower level.

An ESD protection component according to the present invention comprises: first and second discharge electrodes arranged so as to be opposed to each other through a gap, and a discharge inducing portion kept in contact with the first and second discharge electrodes and configured to connect the first and second discharge electrodes to each other; the discharge inducing portion having metal particles, a ceramic material containing glass, and a dielectric material having a dielectric constant higher than that of the ceramic material; and a content of the dielectric material being in the range of 7.5 to 40% by volume, with respect to a total volume of the ceramic material and the dielectric material.

The metal particles may be Pd particles. Furthermore, the dielectric material may be zirconia.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 4 is a drawing showing a cross-sectional configuration along the line IV-IV shown in FIG. 1.

FIG. 5 is a flowchart for explaining a process for manufacturing the ESD protection component according to the first embodiment.

DESCRIPTION OF THE PREFERRED EMBODIMENTS

The embodiments of the present invention will be described below in detail with reference to the accompanying drawings. In the description, identical elements or elements with identical functionality will be denoted by the same reference signs, without redundant description.

First Embodiment

Figure 1:
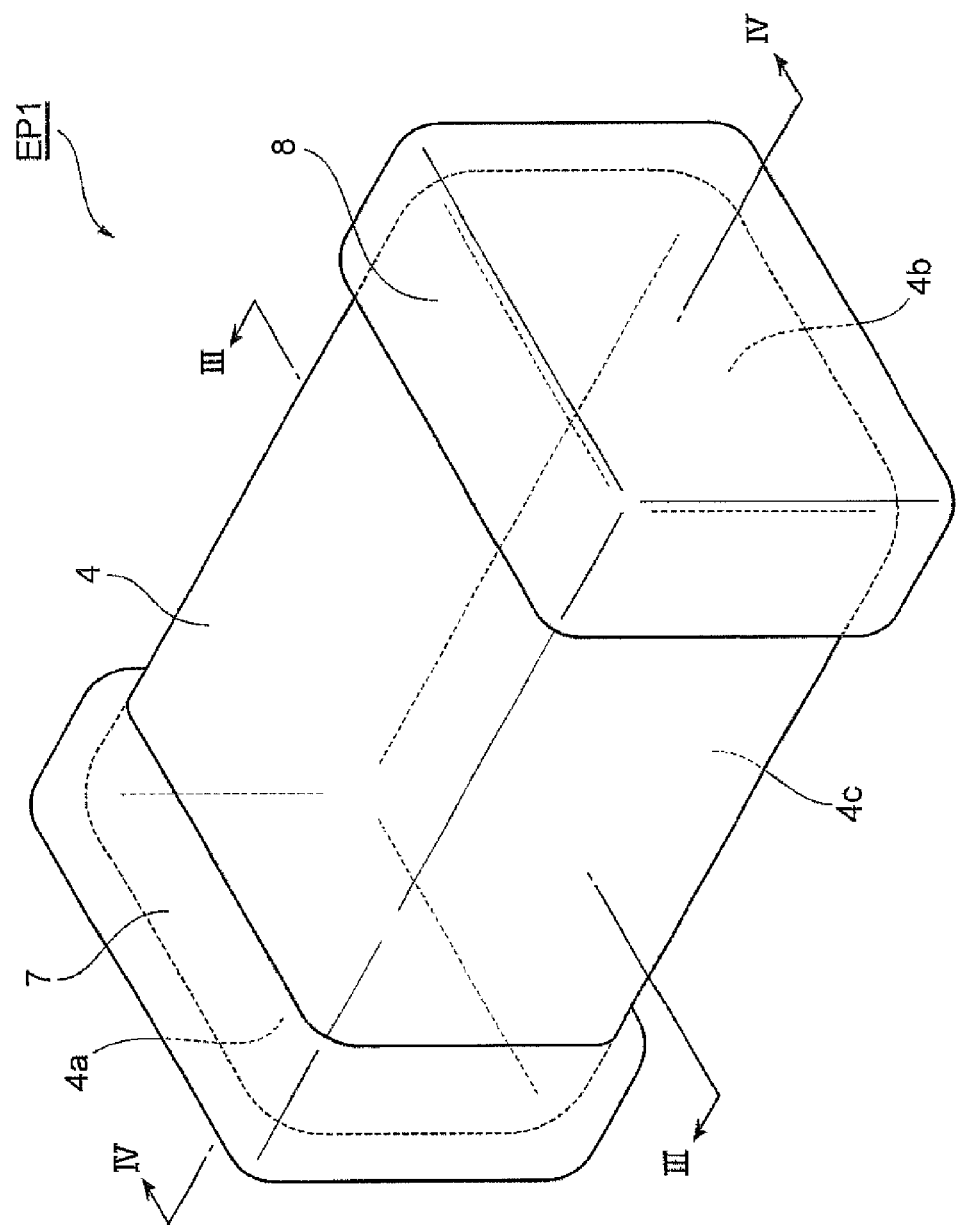
FIG. 1 is a perspective view showing an ESD protection component according to a first embodiment.
Figure 2:
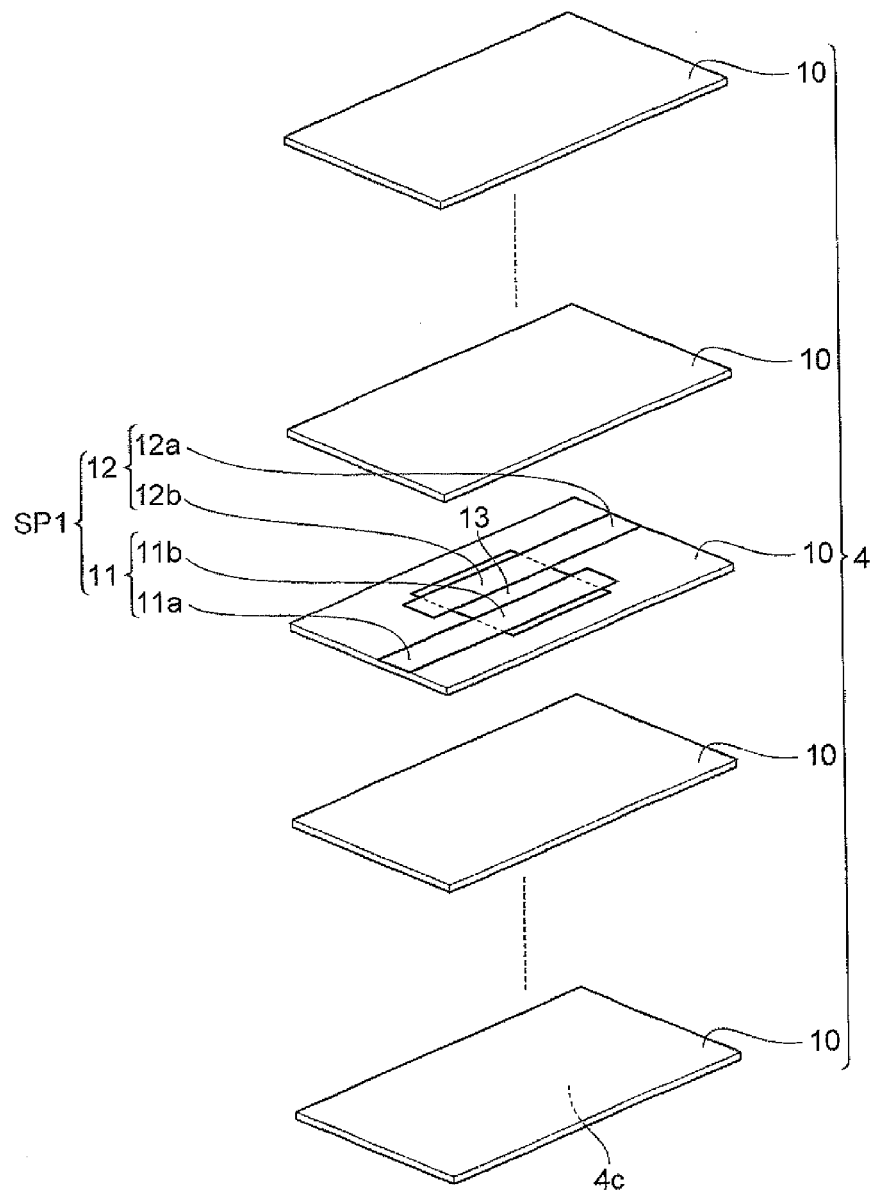
FIG. 2 is an exploded perspective view showing a configuration of an element body according to the first embodiment.
Figure 3:
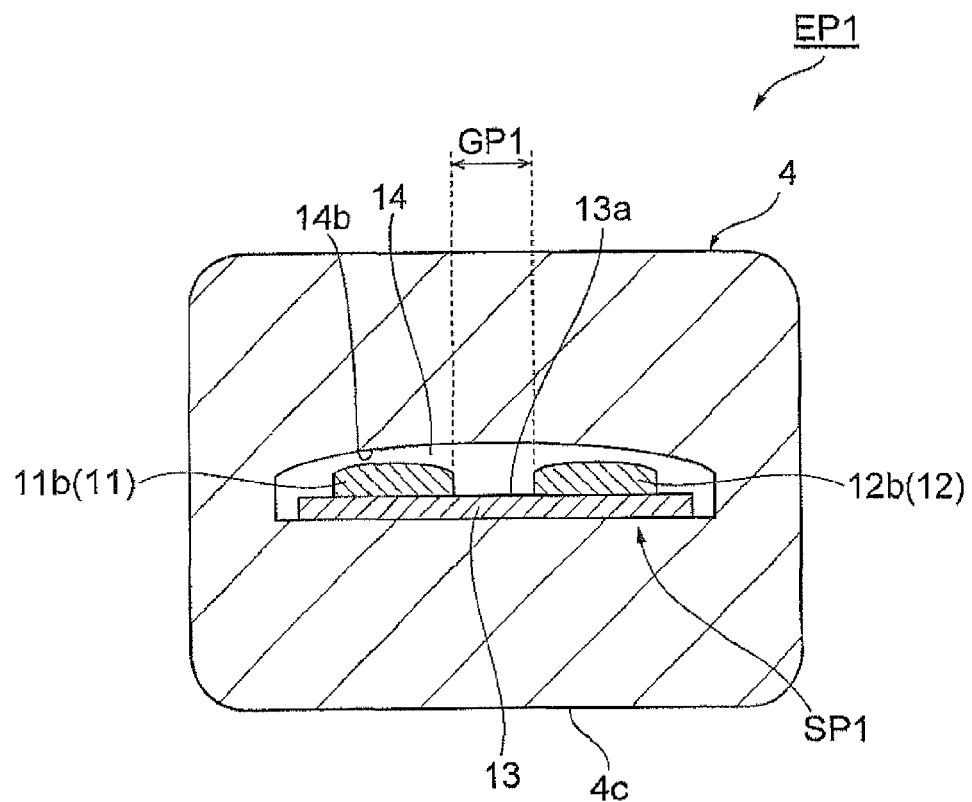
FIG. 3 is a drawing showing a cross-sectional configuration along the line III-III shown in FIG. 1.

First, a configuration of an ESD protection component EP1 according to the first embodiment will be described with reference to FIGS. 1 to 4. FIG. 1 is a perspective view showing the ESD protection component according to the present embodiment. FIG. 2 is an exploded perspective view showing a configuration of an element body. FIG. 3 is a drawing for explaining a cross-sectional configuration along the line shown in FIG. 1. FIG. 4 is a drawing for explaining a cross-sectional configuration along the line IV-IV shown in FIG. 1.

The ESD protection component EP1 is an electronic component that is to be mounted on a circuit board of an electronic device to protect the electronic device from ESD. As shown in FIGS. 1 to 4, the ESD protection component EP1 is provided with an element body 4 of a nearly rectangular parallelepiped shape, an external electrode 7 and an external electrode 8 arranged on the exterior surface of the element body 4, and an ESD suppressor SP1 arranged inside the element body 4. The ESD suppressor SP1 is electrically connected to the external electrode 7 and to the external electrode 8. The ESD suppressor SP1 has ESD absorption capability.

The element body 4 is configured in a configuration wherein a plurality of insulator layers 10 are stacked. Each insulator layer 10 has a nearly rectangular shape. Each insulator layer 10 is an insulator having an electrical insulation property and is composed of a sintered body of an insulator green sheet. In actual element body 4, the insulator layers 10 are integrated with each other so that no boundary can be visually recognized between them. The element body 4 has, as its exterior surface, a pair of end surfaces 4a, 4b opposed to each other, and four side surfaces adjacent to the end surfaces 4a, 4b. One side surface 4c out of the four side surfaces is defined as a surface (mounting surface) facing another electronic device not shown (e.g., a circuit board, an electronic component, or the like).

The external electrode 7 is formed so as to cover the entire area of one end surface 4a of the element body 4 and have portions located on the four side surfaces adjacent to the end surface 4a. Namely, the external electrode 7 is arranged on the one end surface 4a side of the element body 4. The external electrode 8 is formed so as to cover the entire area of the other end surface 4b of the element body 4 and have portions located on the four side surfaces adjacent to the end surface 4b. Namely, the external electrode 8 is arranged on the other end surface 4b side of the element body 4.

The ESD suppressor SP1 is provided with a first discharge electrode 11 and a second discharge electrode 12 and with a discharge inducing portion 13. The first discharge electrode 11 and the second discharge electrode 12 are arranged as separated from each other on the same insulator layer 10. The discharge inducing portion 13 connects the first discharge electrode 11 and the second discharge electrode 12.

The first discharge electrode 11 has a lead portion 11a and an opposed portion 11b. The lead portion 11a extends from the opposed portion 11b so as to be exposed in the end surface 4a. The lead portion 11a is formed integrally with the opposed portion 11b. The opposed portion 11b extends in the longitudinal direction of the insulator layers 10 (a direction in which the pair of end surfaces 4a, 4b are opposed). The lead portion 11a extends from the end on the end surface 4a side of the opposed portion 11b to the end surface 4a in the same width as the opposed portion 11b. The end of the lead portion 11a is exposed in the end surface 4a. The lead portion 11a is connected to the external electrode 7 at the end exposed in the end surface 4a.

The second discharge electrode 12 has a lead portion 12a and an opposed portion 12b. The lead portion 12a extends from the opposed portion 12b so as to be exposed in the end surface 4b. The lead portion 12a is formed integrally with the opposed portion 12b. The opposed portion 12b extends in the longitudinal direction of the insulator layers 10. The lead portion 12a extends from the end on the end surface 4b side of the opposed portion 12b to the end surface 4b in the same width as the opposed portion 12b. The end of the lead portion 12a is exposed in the end surface 4b. The lead portion 12a is connected to the external electrode 8 at the end exposed in the end surface 4b.

The first discharge electrode 11 and the second discharge electrode 12 are arranged as separated from each other so that the opposed portion 11b extending in one direction perpendicular to the stack direction of the insulator layers 10 is opposed to the opposed portion 12b extending in the one direction. Namely, the first discharge electrode 11 and the second discharge electrode 12 are arranged so as to be adjacent in a direction perpendicular to the longitudinal direction of the insulator layers 10. The opposed portion 11b and the opposed portion 12b have thickness. For this reason, a side surface of the opposed portion 11b is opposed to a side surface of the opposed portion 12b. A gap portion GP1 is formed between the opposed portion 11b and the opposed portion 12b (cf. FIG. 3). When a voltage not less than a predetermined value is applied between the external electrode 7 and the external electrode 8, electric discharge occurs in the gap portion GP1 between the first discharge electrode 11 and the second discharge electrode 12. The width of the gap portion GP1 is set at a predetermined value so as to achieve a desired discharge characteristic.

The discharge inducing portion 13 is in contact with the first discharge electrode 11 and the second discharge electrode 12 so as to connect the opposed portion 11b of the first discharge electrode 11 and the opposed portion 12b of the second discharge electrode 12 to each other. Namely, the discharge inducing portion 13 is formed so as to connect the mutually opposed portions of the first and second discharge electrodes 11, 12 to each other. The discharge inducing portion 13 has a function to facilitate occurrence of the electric discharge between the first discharge electrode 11 and the second discharge electrode 12.

The element body 4 has a cavity portion 14 (cf. FIGS. 3 and 4). Surfaces defining the cavity portion 14 include surfaces 13a of the first and second discharge electrodes 11, 12 (the opposed portions 11b, 12b) and the discharge inducing portion 13 (portions exposed from the opposed portions 11b, 12b), and a surface 14b opposed to the surfaces 13a. The cavity portion 14 is located so as to cover the whole of the discharge inducing portion 13, when viewed from the stack direction. The cavity portion 14 is in contact with the opposed portions 11b, 12b and with the discharge inducing portion 13 (the portions exposed from the opposed portions 11b, 12b). The cavity portion 14 has a function to absorb thermal expansion of the first discharge electrode 11, the second discharge electrode 12, the insulator layers 10, and the discharge inducing portion 13 during the electric discharge.

Next, materials of the respective constituent elements will be described.

Each of the external electrodes 7, 8, the first discharge electrode 11, and the second discharge electrode 12 is comprised of a conductor material containing Ag, Pd, Au, Pt, Cu, Ni, Al, Mo, or W. The conductor material to be used for making up the external electrodes 7, 8 can be, for example, an Ag—Pd alloy, Ag—Cu alloy, Ag—Au alloy, or Ag—Pt alloy.

The insulator layers 10 are comprised of a single material selected from $Fe_2O_3$, NiO, CuO, ZnO, MgO, $SiO_2$, $TiO_2$, $Mn_2O_3$, SrO, CaO, BaO, $SnO_2$, $K_2O$, $Al_2O_3$, $ZrO_2$, $B_2O_3$, and so on. The insulator layers 10 may be comprised of a ceramic material in which two or more types of materials among the foregoing materials are mixed. The insulator layers 10 may contain glass. The insulator layers 10 preferably contain copper oxide (CuO or $Cu_2O$) for enabling low-temperature sintering.

The discharge inducing portion 13 has metal particles, a ceramic material containing glass, and a dielectric material having a dielectric constant higher than that of the ceramic material. A content of the dielectric material is set in the range of 7.5 to 40% by volume, with respect to a total volume of the ceramic material and the dielectric material. The metal particles to be used herein are Pd particles or Ag—Pd alloy particles. The glass-containing ceramic material to be used herein is, for example, a dielectric ceramic composition containing $SiO_2$—$K_2O$—$B_2O_3$-based glass as a major component, or the dielectric ceramic composition described in Japanese Patent Application Laid-open Publication No. 2009-298684. The dielectric material to be used herein is, for example, zirconia ($ZrO_2$) or calcium-zirconium oxide ($CaZrO_3$). The relative dielectric constant of zirconia is approximately 40.

The dielectric ceramic composition containing $SiO_2$—$K_2O$—$B_2O_3$-based glass as a major component is, for example, a dielectric ceramic composition containing $SiO_2$—$K_2O$—$B_2O_3$-based glass, quartz, and amorphous silica as major components and containing alumina and $K_2O$-$MO$—$SiO_2$—$B_2O_3$-based glass (where MO is at least either CaO or SrO) as minor components. In this dielectric ceramic composition, respective content rates of the $SiO_2$—$K_2O$—$B_2O_3$-based glass, quartz, and amorphous silica in the major components with respect to 100% by weight of the total of the major components are $SiO_2$—$K_2O$—$B_2O_3$-based glass 40 to 65% by weight, quartz 35 to 50% by weight, and amorphous silica the rest. Contents of the alumina and $K_2O$-$MO$—$SiO_2$—$B_2O_3$-based glass with respect to 100% by weight of the major components are alumina 1.5 to 4% by weight and $K_2O$-$MO$—$SiO_2$—$B_2O_3$-based glass 5 to 20% by weight. The relative dielectric constant of this dielectric ceramic composition is from 4 to 5.

The dielectric ceramic composition described in the foregoing Laid-open Publication No. 2009-298684 contains: one selected from a single oxide of Zn and, an oxide of Mg and an oxide of Zn; an oxide of Cu; and an oxide of Si, as major components, and further contains: a glass component containing at least one selected from an oxide of Si, an oxide of Ba, an oxide of Ca, an oxide of Sr, an oxide of Li, and an oxide of Zn; and an oxide of B and having the softening point of glass of not more than 750° C., as a minor component. A content of the glass component is in the range of 1.5 to 15% by weight with respect to 100% by weight of the major components. The relative dielectric constant of this dielectric ceramic composition is from 6 to 8.

Next, a method for manufacturing the ESD protection component EP1 will be described with reference to FIG. 5. FIG. 5 is a flowchart showing the method for manufacturing the ESD protection component according to the first embodiment.

First, a slurry of the material for making up the insulator layers 10 is prepared (S101) and green sheets for the insulator layers 10 are formed using the slurry (S103). Specifically, the slurry for the insulator layers 10 is prepared by mixing a predetermined amount of dielectric powder containing copper oxide (CuO) with an organic vehicle containing an organic solvent and an organic binder. The dielectric powder to be used herein can be a dielectric material containing an oxide of Mg, Cu, Zn, Si, or Sr (or may be one of other dielectric materials) as a major component. Thereafter, the slurry is applied onto PET film by the doctor blade method to form green sheets in the thickness of about 20 μm.

After the formation of the green sheets for the insulator layers 10, a discharge inducing material slurry, a conductor paste, and a solvent (lacquer for forming cavity) are printed at respective predetermined positions on the green sheet (S105). In this process, first, the discharge inducing material slurry for formation of the discharge inducing portion 13 is printed (S105A). The discharge inducing material slurry is prepared by mixing the metal particles, the glass-containing ceramic material, and the dielectric material with the dielectric constant higher than that of the ceramic material, weighed to respective predetermined amounts, with an organic vehicle containing an organic solvent and an organic binder. The discharge inducing material slurry is applied onto the sheet for the insulator layer 10 by the screen printing method or the like. The discharge inducing material slurry becomes the discharge inducing portion 13 through a below-described firing process.

Next, the conductor paste for formation of the first and second discharge electrodes 11, 12 is printed (S105B). The conductor paste is applied onto the green sheet for the insulator layer 10 on which the discharge inducing material slurry has been printed, by the screen printing method or the like. The conductor paste becomes the first and second discharge electrodes 11, 12 through the below-described firing process.

Next, the lacquer for forming cavity is printed (S105C). The lacquer for forming cavity is applied onto the green sheet for the insulator layer 10 so as to cover the discharge inducing material slurry and the conductor paste previously printed, by the screen printing method or the like. The lacquer for forming cavity is a paint for formation of the cavity portion 14.

Next, the green sheets for the insulator layers 10 including the green sheet on which the discharge inducing material slurry, the conductor paste, and the lacquer for forming cavity have been printed are stacked in order (S107) and pressed (S109), to obtain a multilayer body thereof. Thereafter, the resulting multilayer body is cut in chip units (S111) to obtain a plurality of green chips.

Subsequently, each of the green chips thus obtained is polished by barrel polishing (S113). After this polishing, we obtain the green chips with their corners and ridge lines rounded.

Next, the green chips are fired under predetermined conditions (e.g., 850-950° C. in the atmosphere for two hours) (S115). By this process, the green chips are fired to obtain the element bodies 4. The lacquer for forming cavity vanishes through the firing process. This process results in forming the cavity portion 14 covering the opposed portions 11b, 12b of the first and second discharge electrodes 11, 12 and the discharge inducing portion 13 (the portions exposed from the opposed portions 11b, 12b). As a result, the ESD suppressor SP1 with the first discharge electrode 11, the second discharge electrode 12, the discharge inducing portion 13, and the cavity portion 14 is formed in the element bodies 4. Namely, we obtain the element bodies 4 inside which the ESD suppressor SP1 is arranged, through the firing process.

Next, a conductor paste for the external electrodes 7, 8 is applied onto each element body 4 (S117) and each element body 4 with the conductor paste applied thereto is subjected to a thermal treatment under predetermined conditions (e.g., 600-800° C. in the atmosphere for two hours), to sinter the conductor paste for the external electrodes 7, 8 on each element body 4 (S119). This process results in forming the external electrodes 7, 8 on the exterior surface of each element body 4. The external electrode 7 is formed so as to be connected to the lead portion 11a of the first discharge electrode 11. The external electrode 8 is fanned so as to be connected to the lead portion 12a of the second discharge electrode 12. Thereafter, the surface of each of the external electrodes 7, 8 is plated (S121). The plating herein is preferably electrolytic plating and can be performed, for example, using Ni/Sn, Cu/Ni/Sn, Ni/Pd/Au, Ni/Pd/Ag, or Ni/Ag.

The ESD protection components EP1 are obtained through these processes.

The relationship between the content of the dielectric material in the discharge inducing portion 13 and discharge start voltage will be described below in detail. The Inventors conducted Tests 1 to 4 as described below, in order to clarify the relationship between the content of the dielectric material in the discharge inducing portion 13 and discharge start voltage.

(Test 1)

Figures 6A, 6B:
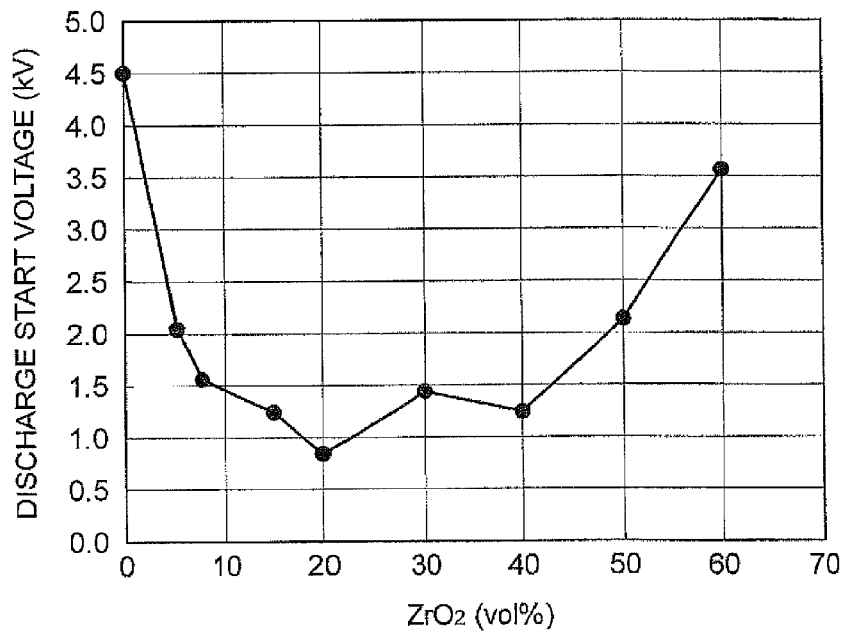
FIG. 6A and FIG. 6B are drawings showing the measurement results in Test 1.

A plurality of samples were prepared with different contents of the dielectric material in the discharge inducing portion 13 and discharge start voltages of the respective samples were measured. The measurement results of the samples are shown in FIG. 6A and FIG. 6B. The samples had the same configuration except for the difference in the content of the dielectric material in the discharge inducing portion 13. In each sample the metal particles used were Pd particles. The aforementioned ceramic material used was the dielectric ceramic composition containing the $SiO_2$—$K_2O$—$B_2O_3$-based glass as a major component. The dielectric material used was zirconia.

In the dielectric ceramic composition used in Test 1, the respective content rates of the $SiO_2$—$K_2O$—$B_2O_3$-based glass, quartz, and amorphous silica are $SiO_2$—$K_2O$—$B_2O_3$-based glass 50% by weight, quartz 42.5% by weight, and amorphous silica the rest. The contents of the alumina and $K_2O$-MO—$SiO_2$—$B_2O_3$-based glass with respect to 100% by weight of the major components are alumina 2% by weight and $K_2O$-MO—$SiO_2$—$B_2O_3$-based glass 10% by weight. The content of the Pd particles is 63% by weight with respect to 100% by weight of all the materials of the discharge inducing portion 13.

It is seen from the measurement results shown in FIG. 6A and FIG. 6B that the discharge start voltage is reduced when the content of the dielectric material is set in the range of 7.5 to 40% by volume, with respect to the total volume of the ceramic material and the dielectric material. It is also understood that the discharge start voltage is further reduced when the content of the dielectric material is set in the range of 15 to 40% by volume, with respect to the total volume of the ceramic material and the dielectric material.

(Test 2)

A plurality of samples were prepared with use of Ag—Pd alloy particles as the metal particles and with different contents of the dielectric material in the discharge inducing portion 13 and discharge start voltages of the respective samples were measured. The measurement results of the samples are shown in FIG. 7A and FIG. 7B.

The dielectric ceramic composition used in Test 2 is the same as that used in Test 1. The respective content rates of the $SiO_2$—$K_2O$—$B_2O_3$-based glass, quartz, and amorphous silica are $SiO_2$—$K_2O$—$B_2O_3$-based glass 50% by weight, quartz 42.5% by weight, and amorphous silica the rest. The contents of the alumina and $K_2O$-MO—$SiO_2$—$B_2O_3$-based glass with respect to 100% by weight of the major components are alumina 2% by weight and $K_2O$-MO—$SiO_2$—$B_2O_3$-based glass 10% by weight. The content of the Ag—Pd alloy is 60.8% by weight, with respect to 100% by weight of all the materials of the discharge inducing portion 13.

Figures 7A, 7B:
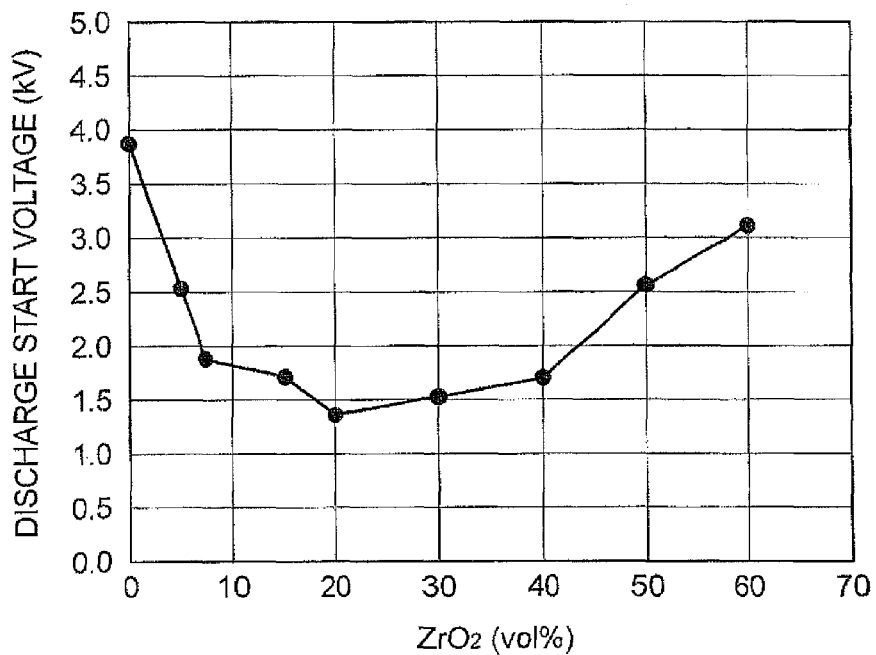
FIG. 7A and FIG. 7B are drawings showing the measurement results in Test 2.

It is seen from the measurement results shown in FIG. 7A and FIG. 7B, that the discharge start voltage is reduced when the content of the dielectric material is set in the range of 7.5 to 40% by volume, with respect to the total volume of the ceramic material and the dielectric material. It is also understood that the discharge start voltage is further reduced when the content of the dielectric material is set in the range of 15 to 40% by volume, with respect to the total volume of the ceramic material and the dielectric material.

(Test 3)

A plurality of samples were prepared with use of Pd particles as the metal particles and the dielectric ceramic composition described in the aforementioned Laid-open Publication No. 2009-298684 as the ceramic material and with different contents of the dielectric material in the discharge inducing portion 13 and discharge start voltages of the respective samples were measured. The measurement results of the samples are shown in FIG. 8A and FIG. 8B.

The dielectric ceramic composition used in Test 3 is one containing $2.05(0.691MgO.0.213ZnO.0.097CuO).SiO_2$ as a major component and $B_2O_3$—$SiO_2$—SrO-based glass as a minor component. The content of the minor component is 4% by weight with respect to 100% by weight of the major component. The content of the Pd particles is 56.4% by weight, with respect to 100% by weight of all the materials of the discharge inducing portion 13.

Figures 8A, 8B:
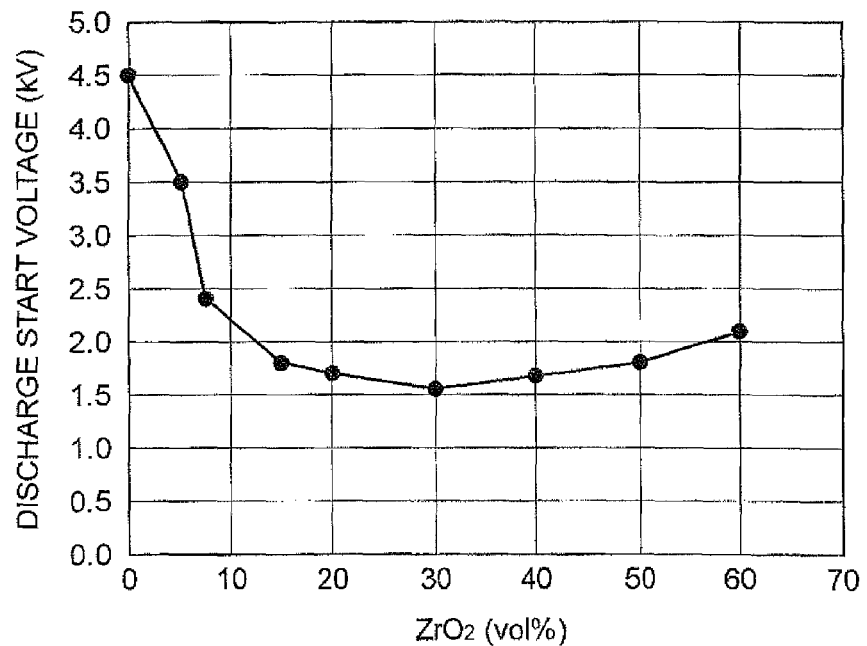
FIG. 8A and FIG. 8B are drawings showing the measurement results in Test 3.

It is seen from the measurement results shown in FIG. 8A and FIG. 8B that the discharge start voltage is reduced when the content of the dielectric material is set in the range of 7.5 to 40% by volume, with respect to the total volume of the ceramic material and the dielectric material. It is also understood that the discharge start voltage is further reduced when the content of the dielectric material is set in the range of 15 to 40% by volume, with respect to the total volume of the ceramic material and the dielectric material.

(Test 4)

A plurality of samples were prepared with use of Ag—Pd alloy particles as the metal particles and with different contents of the dielectric material in the discharge inducing portion 13 and discharge start voltages of the respective samples were measured. The measurement results of the samples are shown in FIG. 9A and FIG. 9B.

The dielectric ceramic composition used in Test 4 is the same as that used in Test 3. Namely, the dielectric ceramic composition used in Test 4 is one containing $2.05(0.691MgO.0.213ZnO.0.097CuO).SiO_2$ as a major component and $B_2O_3$—$SiO_2$—SrO-based glass as a minor component. The content of the minor component is 4% by weight with respect to 100% by weight of the major component. The content of the Ag—Pd alloy is 54.1% by weight, with respect to 100% by weight of all the materials of the discharge inducing portion 13.

Figures 9A, 9B:
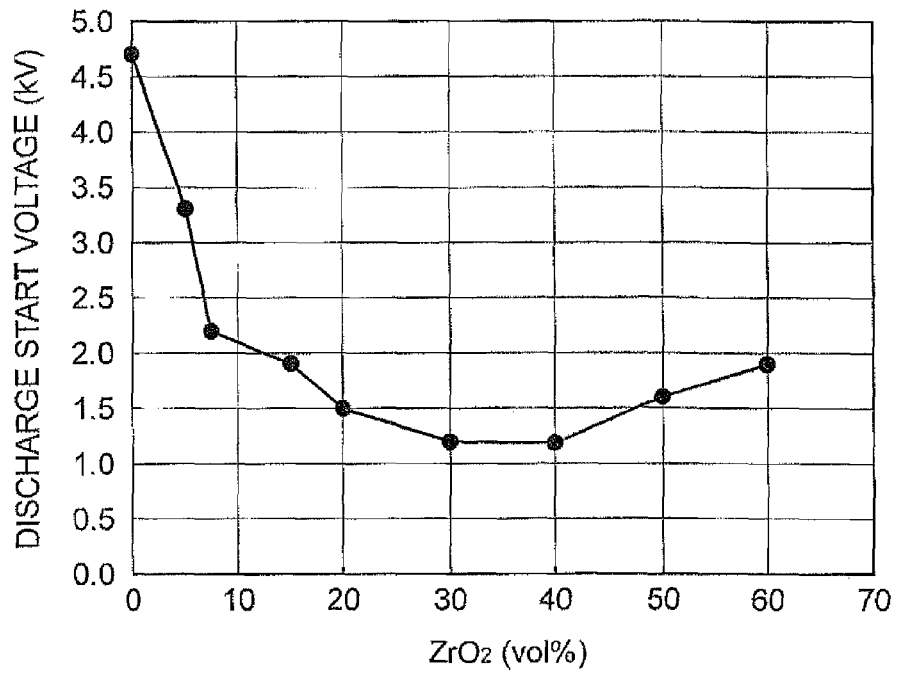
FIG. 9A and FIG. 9B are drawings showing the measurement results in Test 4.

It is seen from the measurement results shown in FIG. 9A and FIG. 9B that the discharge start voltage is reduced when the content of the dielectric material is set in the range of 7.5 to 40% by volume, with respect to the total volume of the ceramic material and the dielectric material. It is also understood that the discharge start voltage is further reduced when the content of the dielectric material is set in the range of 15 to 40% by volume, with respect to the total volume of the ceramic material and the dielectric material.

As described above, the discharge start voltage of the ESD protection component EP1 can be set at a lower level when the discharge inducing portion 13 has the metal particles, the glass-containing ceramic material, and the dielectric material having the dielectric constant higher than that of the ceramic material and when the content of the dielectric material is in the range of 7.5 to 40% by volume, with respect to the total volume of the ceramic material and the dielectric material.

When the metal particles are the Pd particles, the reliability of the ESD protection component EP1 improves. Pd is less likely to cause ion migration or less likely to ionize than Ag. Ion migration tends to accelerate, particularly, under high-humidity environments. If ion migration occurs in the discharge inducing portion 13, a short circuit easily occurs between the first discharge electrode 11 and the second discharge electrode 12, to degrade the discharge characteristic. Therefore, the reliability of the ESD protection component EP1 improves when the metal particles are the Pd particles less likely to cause ion migration.

When the dielectric material is zirconium, the discharge characteristic of the ESD protection component EP1 improves. Zirconium has the relatively high dielectric constant and thus is likely to cause electric field concentration. This improves the discharge characteristic of the ESD protection component EP1.

When zirconium is contained as a constituent material of the discharge inducing portion 13, the metal particles exist as moderately dispersed in the discharge inducing portion 13. This also improves the discharge characteristic of the ESD protection component EP1. If the metal particles exist in an aggregated state, ion migration could accelerate in portions where the distance between the metal particles is short. Therefore, the reliability of the ESD protection component EP1 also improves when the discharge inducing portion 13 contains zirconium.

Second Embodiment

Figure 10:
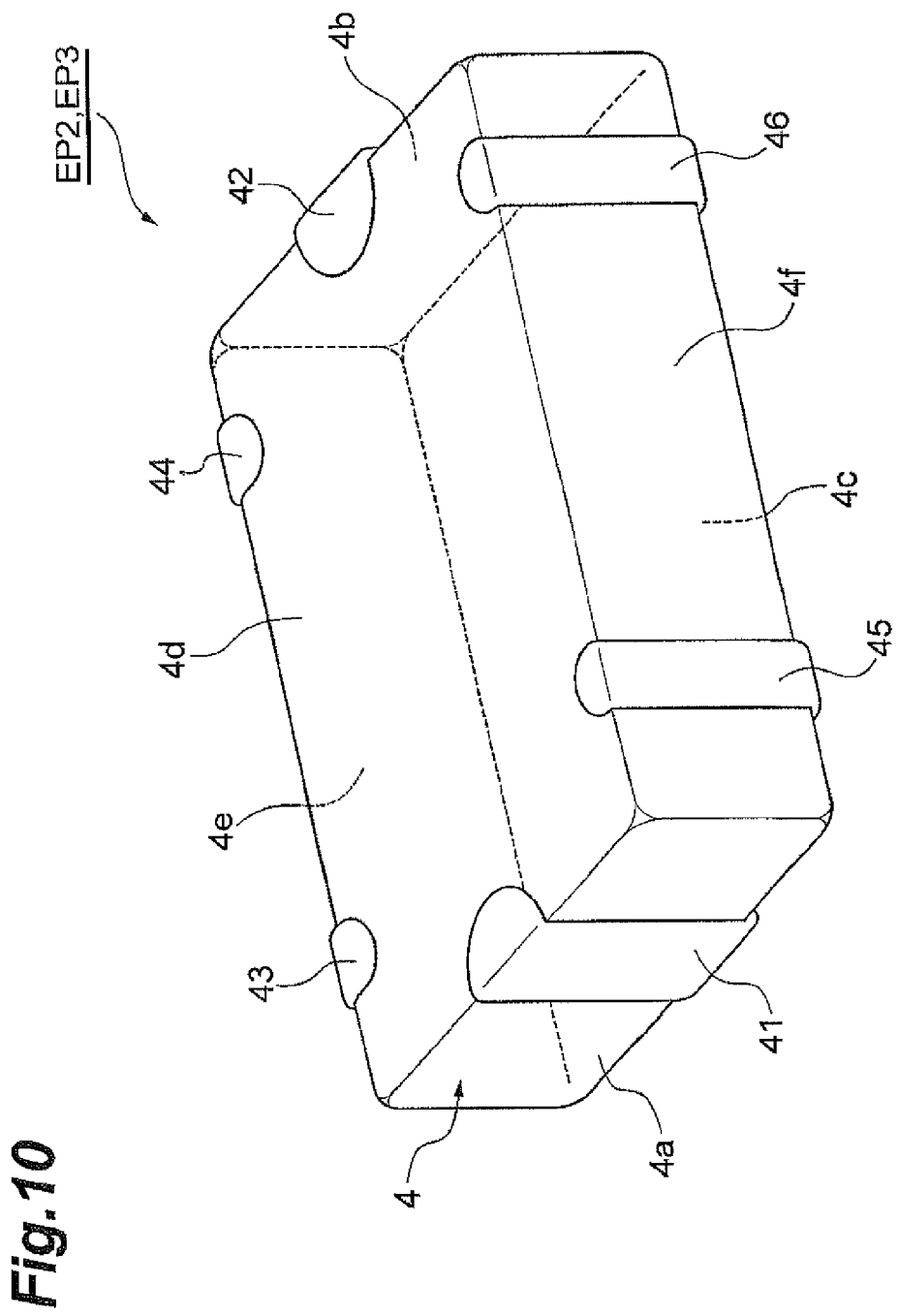
FIG. 10 is a perspective view showing an ESD protection component according to second and third embodiments.
Figure 11:
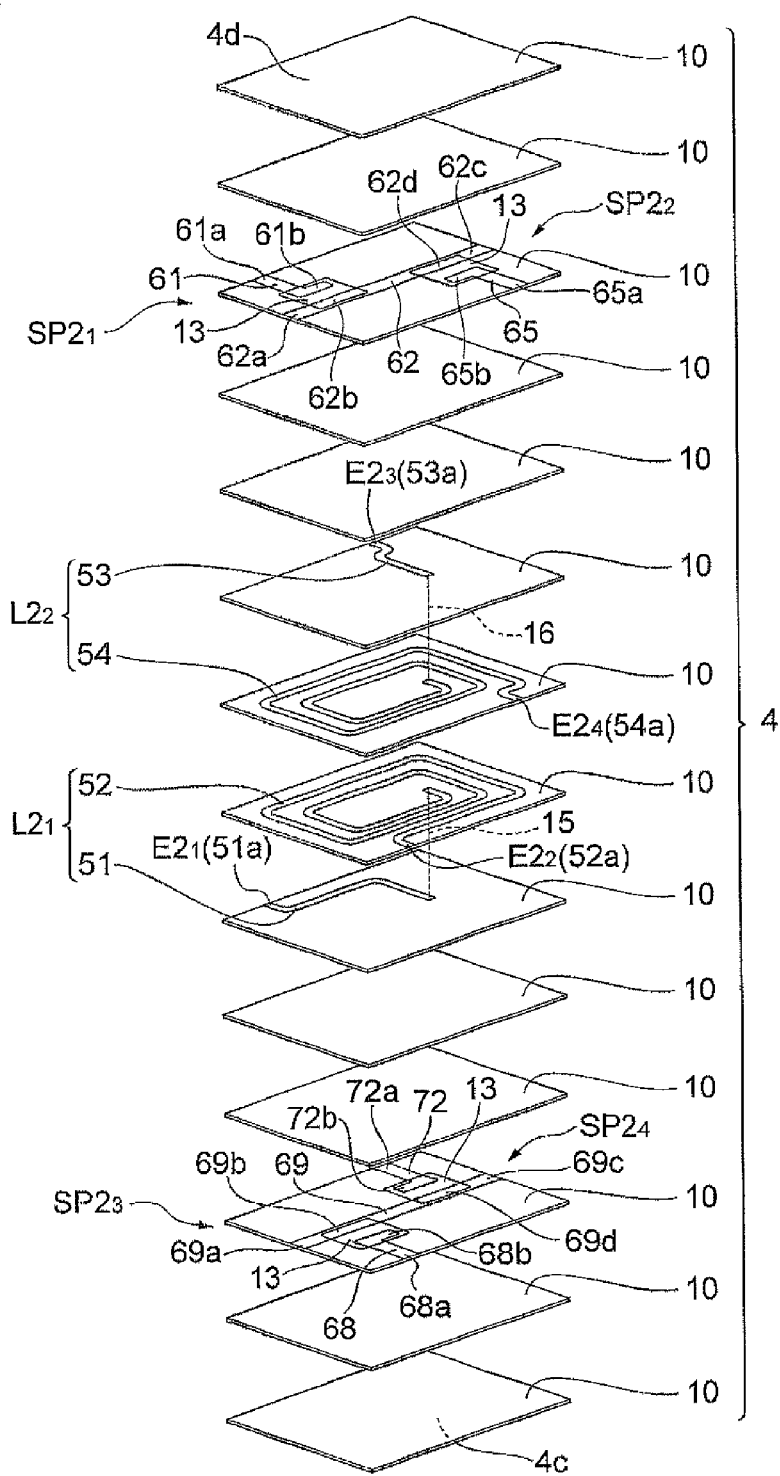
FIG. 11 is an exploded perspective view showing a configuration of an element body according to the second embodiment.
Figure 12:
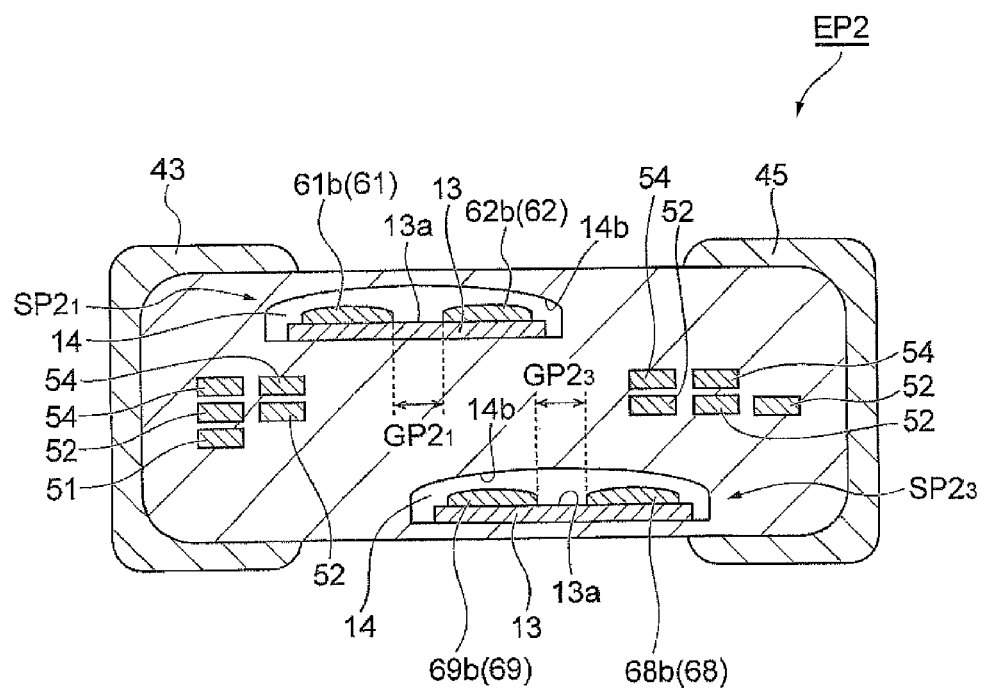
FIG. 12 is a drawing showing a cross-sectional configuration including a first ESD suppressor and a third ESD suppressor, of the ESD protection component according to the second embodiment.
Figure 13:
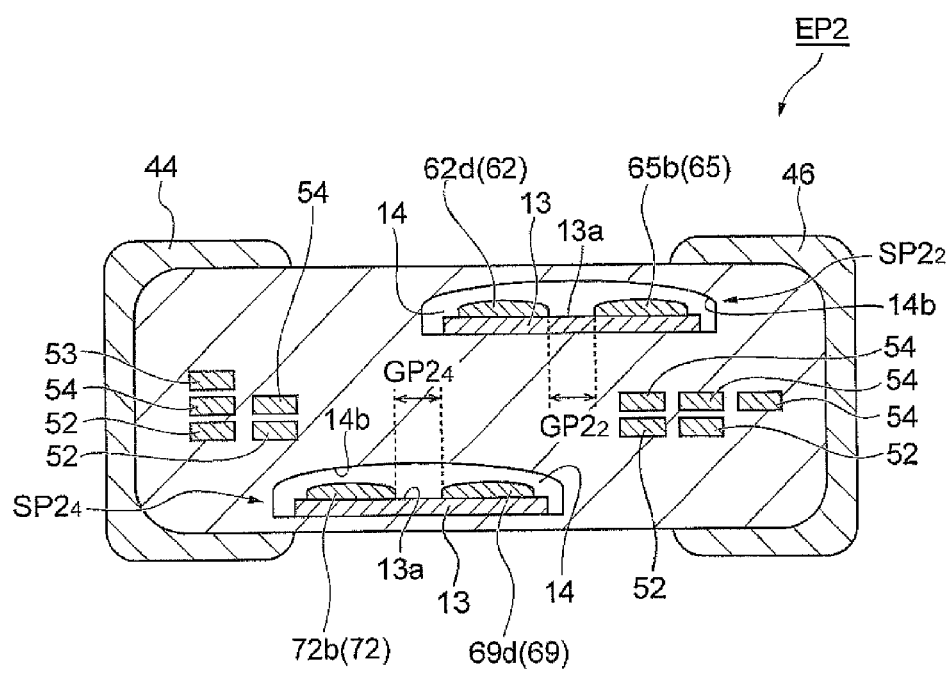
FIG. 13 is a drawing showing a cross-sectional configuration including a second ESD suppressor and a fourth ESD suppressor, of the ESD protection component according to the second embodiment.
Figure 14:
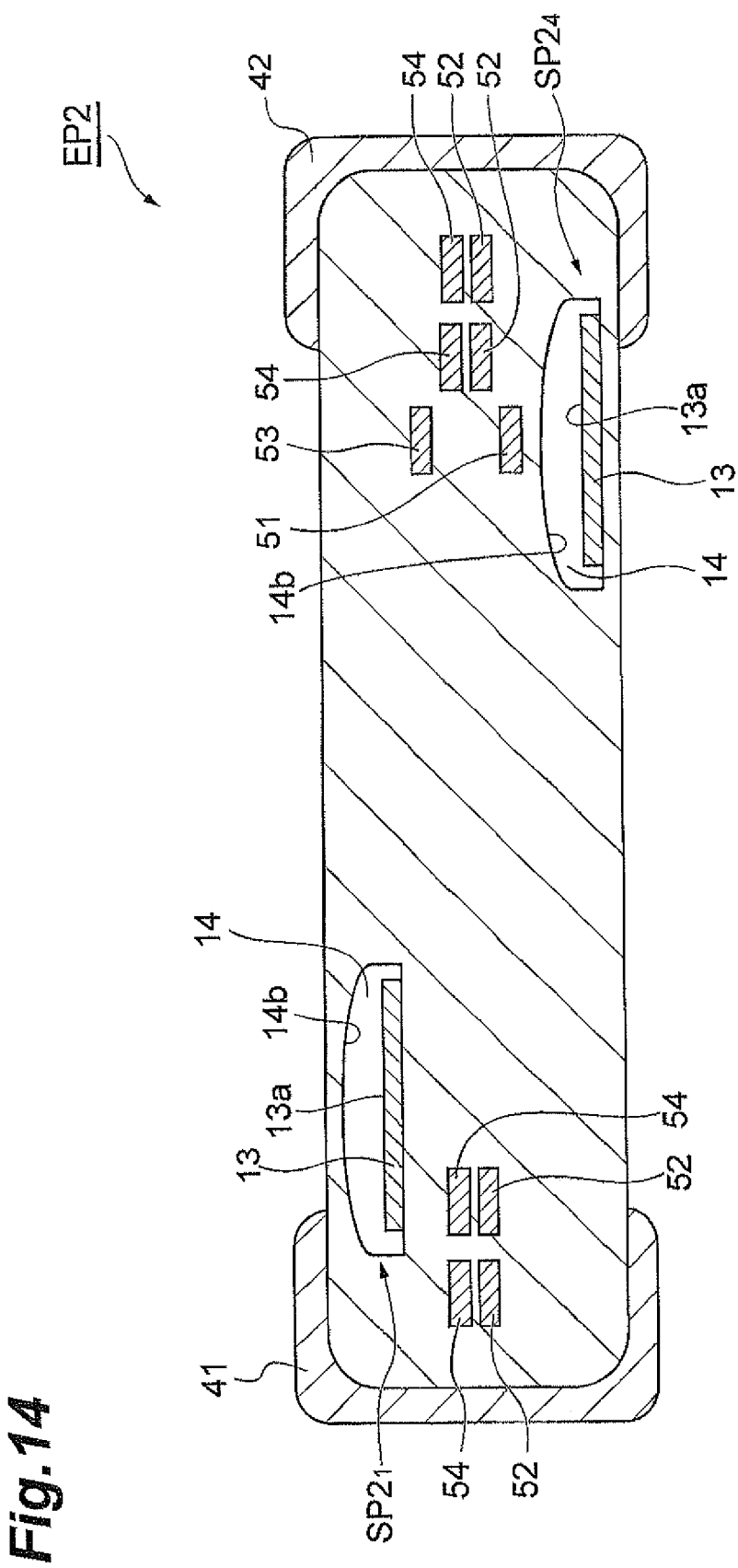
FIG. 14 is a drawing showing a cross-sectional configuration including the first ESD suppressor and the fourth ESD suppressor, of the ESD protection component according to the second embodiment.

Next, a configuration of an ESD protection component EP2 according to the second embodiment will be described with reference to FIGS. 10 to 14. FIG. 10 is a perspective view showing the ESD protection component according to the second and third embodiments. FIG. 11 is an exploded perspective view showing a configuration of an element body according to the second embodiment. FIG. 12 is a drawing showing a cross-sectional configuration including a first ESD suppressor and a third ESD suppressor, of the ESD protection component according to the second embodiment. FIG. 13 is a drawing showing a cross-sectional configuration including a second ESD suppressor and a fourth ESD suppressor, of the ESD protection component according to the second embodiment. FIG. 14 is a drawing showing a cross-sectional configuration including the first ESD suppressor and the fourth ESD suppressor, of the ESD protection component according to the second embodiment.

The ESD protection component EP2, as shown in FIGS. 10 to 14, is provided with the element body 4 and with a plurality of external electrodes 41 to 46 arranged on the exterior surface of the element body 4. The ESD protection component EP2 is further provided with a first coil $L2_1$ and a second coil $L2_2$ and with a first ESD suppressor $SP2_1$, a second ESD suppressor $SP2_2$, a third ESD suppressor $SP2_3$, and a fourth ESD suppressor $SP2_4$. The first and second coils $L2_1$, $L2_2$ and the first to fourth suppressors $SP2_1$ to $SP2_4$ are arranged inside the element body 4. The first to fourth suppressors $SP2_1$ to $SP2_4$ have the ESD absorption capability.

The element body 4 has a pair of end surfaces 4a, 4b opposed to each other, and four side surfaces 4c, 4d, 4e, and 4f adjacent to the end surfaces 4a, 4b, as its exterior surface. The side surface 4c and the side surface 4d are opposed to each other and the side surface 4e and the side surface 4f are opposed to each other. The side surface 4c and the side surface 4d extend in the direction in which the pair of end surfaces 4a, 4b are opposed, so as to connect the pair of end surfaces 4a, 4b. The side surface 4c and the side surface 4d also extend in the direction in which the side surface 4e and the side surface 4f are opposed. The side surface 4e and the side surface 4f extend in the direction in which the pair of end surfaces 4a, 4b are opposed, so as to connect the pair of end surfaces 4a, 4b. The side surface 4e and the side surface 4f also extend in the direction in which the side surface 4c and the side surface 4d are opposed. The direction in which the side surface 4c and the side surface 4d are opposed coincides with the direction in which the insulator lays 10 are stacked.

The external electrode 41 is formed across between the side surface 4c and the side surface 4d so as to cover a portion of the end surface 4a along the direction in which the side surface 4c and the side surface 4d are opposed. The external electrode 42 is formed across between the side surface 4c and the side surface 4d so as to cover a portion of the end surface 4b along the direction in which the side surface 4c and the side surface 4d are opposed.

The external electrode 43 and the external electrode 44 are arranged on the side surface 4e side. The external electrode 43 and the external electrode 44 are formed across between the side surface 4c and the side surface 4d so as to cover a portion of the side surface 4e along the direction in which the side surface 4c and the side surface 4d are opposed. The external electrode 43 is located on the end surface 4a side and the external electrode 44 is located on the end surface 4b side.

The external electrode 45 and the external electrode 46 are arranged on the side surface 4f side. The external electrode 45 and the external electrode 46 are formed across between the side surface 4c and the side surface 4d so as to cover a portion of the side surface 4f along the direction in which the side surface 4c and the side surface 4d are opposed. The external electrode 45 is located on the end surface 4a side and the external electrode 46 is located on the end surface 4b side.

The first coil $L2_1$ and the second coil $L2_2$ are located in an order of the first coil $L2_1$ and the second coil $L2_2$ named from the side nearer to the side surface 4c of the element body 4, in the stack direction of the insulator layers 10.

The first coil $L2_1$ is constructed in a configuration wherein ends of a conductor 51 and a conductor 52 are connected by a through-hole conductor 15 located between the conductor 51 and the conductor 52. The conductor 51 and the conductor 52 are juxtaposed in the stack direction of the insulator layers 10 inside the element body 4. The conductor 52 has a spiral shape. The conductor 51 and the conductor 52 are located in an order of the conductor 51 and the conductor 52 named from the side nearer to the side surface 4c, in the stack direction of the insulator layers 10.

An end 51a of the conductor 51 is exposed in the side surface 4e and is connected to the external electrode 43. An end 52a of the conductor 52 is exposed in the side surface 4f of the element body 4 and is connected to the external electrode 45. The end 51a of the conductor 51 corresponds to one end $E2_1$ of the first coil $L2_1$ and the end 52a of the conductor 52 corresponds to the other end $E2_2$ of the first coil $L2_1$. The first coil $L2_1$ is electrically connected to each of the external electrodes 43, 45.

The second coil $L2_2$ is constructed in a configuration wherein ends of a conductor 53 and a conductor 54 are connected by a through-hole conductor 16 located between the conductor 53 and the conductor 54. The conductor 53 and the conductor 54 are juxtaposed in the stack direction of the insulator layers 10 inside the element body 4. The conductor 54 has a spiral shape. The conductor 53 and the conductor 54 are located in an order of the conductor 53 and the conductor 54 named from the side nearer to the side surface 4d, in the stack direction of the insulator layers 10.

An end 53a of the conductor 53 is exposed in the side surface 4e and is connected to the external electrode 44. An end 54a of the conductor 54 is exposed in the side surface 4f of the element body 4 and is connected to the external electrode 46. The end 53a of the conductor 53 corresponds to one end $E2_3$ of the second coil $L2_2$ and the end 54a of the conductor 54 corresponds to the other end $E2_4$ of the second coil $L2_2$. The second coil $L2_2$ is electrically connected to each of the external electrodes 44, 46.

The conductor 52 and the conductor 54 of the spiral shape are located so as to be adjacent to each other in the stack direction of the insulator layers 10. The first coil $L2_1$ and the second coil $L2_2$ constitute a so-called common mode filter while the conductor 52 and the conductor 54 are magnetically coupled.

The first and second ESD suppressors $SP2_1$, $SP2_2$ are located on the same layer. The first and second ESD suppressors $SP2_1$, $SP2_2$ are located nearer to the side surface 4d than the second coil $L2_2$, in the stack direction of the insulator layers 10. The third and fourth ESD suppressors $SP2_3$, $SP2_4$ are located on the same layer. The third and fourth ESD suppressors $SP2_3$, $SP2_4$ are located nearer to the side surface 4c than the first coil $L2_1$, in the stack direction of the insulator layers 10.

The first ESD suppressor $SP2_1$ is provided with a first discharge electrode 61 and a second discharge electrode 62 and with the discharge inducing portion 13. The first discharge electrode 61 and the second discharge electrode 62 are arranged on the same insulator layer 10 while being separated from each other. The discharge inducing portion 13 connects the first discharge electrode 61 and the second discharge electrode 62.

The first discharge electrode 61 has a lead portion 61a and an opposed portion 61b. The lead portion 61a extends in the transverse direction of the insulator layers 10 (the direction in which the side surface 4e and the side surface 4f are opposed). The opposed portion 61b extends in the longitudinal direction of the insulator layers 10 (the direction in which the pair of end surfaces 4a, 4b are opposed). The lead portion 61a and the opposed portion 61b are integrally formed. The first discharge electrode 61 has an L-shape. The lead portion 61a is exposed in the side surface 4e and is connected to the external electrode 43. Namely, the first discharge electrode 61 is electrically connected through the external electrode 43 to the one end $E2_1$ of the first coil $L2_1$. The opposed portion 61b is opposed to the second discharge electrode 62.

The second discharge electrode 62 extends in the longitudinal direction of the insulator layers 10. The second discharge electrode 62 has a lead portion 62a and an opposed portion 62b. The lead portion 62a is exposed in the end surface 4a and connected to the external electrode 41. The opposed portion 62b is opposed to the opposed portion 61b of the first discharge electrode 61 in the transverse direction of the insulator layers 10.

The first discharge electrode 61 and the second discharge electrode 62 are arranged as separated from each other so that the opposed portion 61b is opposed to the opposed portion 62b. A gap portion $GP2_1$ is formed between the opposed portion 61b and the opposed portion 62b (cf. FIG. 12). When the voltage not less than the predetermined value is applied between the external electrode 41 and the external electrode 43, the electric discharge occurs in the gap portion $GP2_1$ between the first discharge electrode 61 and the second discharge electrode 62. The width of the gap portion $GP2_1$ is set at a predetermined value so as to achieve a desired discharge characteristic.

The discharge inducing portion 13 is in contact with the first discharge electrode 61 and the second discharge electrode 62 so as to connect the opposed portion 61b of the first discharge electrode 61 and the opposed portion 62b of the second discharge electrode 62 to each other. Namely, the discharge inducing portion 13 is formed so as to connect the mutually opposed portions of the first and second discharge electrodes 61, 62 to each other and has a function to facilitate occurrence of the electric discharge between the first discharge electrode 61 and the second discharge electrode 62.

The element body 4 has the cavity portion 14 (cf. FIGS. 12 and 14) at the position of the first ESD suppressor $SP2_1$. Surfaces defining the cavity portion 14 include surfaces 13a of the first and second discharge electrodes 61, 62 (the opposed portions 61b, 62b) and the discharge inducing portion 13 (the portions exposed from the opposed portions 61b, 62b), and a surface 14b opposed to the surfaces 13a. The cavity portion 14 is located so as to cover the whole of the discharge inducing portion 13 when viewed from the stack direction. The cavity portion 14 is in contact with the opposed portions 61b, 62b and with the discharge inducing portion 13 (the portions exposed from the opposed portions 61b, 62b). The cavity portion 14 has a function to absorb thermal expansion of the first discharge electrode 61, the second discharge electrode 62, the insulator layers 10, and the discharge inducing portion 13 during the electric discharge.

The second ESD suppressor $SP2_2$ is provided with a first discharge electrode 65 and the second discharge electrode 62 and with the discharge inducing portion 13. The first discharge electrode 65 and the second discharge electrode 62 are arranged on the same insulator layer 10 while being separated from each other. The discharge inducing portion 13 connects the first discharge electrode 65 and the second discharge electrode 62.

The first discharge electrode 65 has a lead portion 65a and an opposed portion 65b. The lead portion 65a extends in the transverse direction of the insulator layers 10. The opposed portion 65b extends in the longitudinal direction of the insulator layers 10. The lead portion 65a and the opposed portion 65b are integrally formed. The first discharge electrode 65 has an L-shape. The lead portion 65a is exposed in the side surface 4f and is connected to the external electrode 46. Namely, the first discharge electrode 65 is electrically connected through the external electrode 46 to the other end $E2_4$ of the second coil $L2_2$. The opposed portion 65b is opposed to the second discharge electrode 62.

The second discharge electrode 62 has a lead portion 62c and an opposed portion 62d. The lead portion 62c is exposed in the end surface 4b and connected to the external electrode 42. The opposed portion 62d is opposed to the opposed portion 65b of the first discharge electrode 65 in the transverse direction of the insulator layers 10. The lead portions 62a, 62c and the opposed portions 62b, 62d are integrally formed.

The first discharge electrode 65 and the second discharge electrode 62 are arranged as separated from each other so that the opposed portion 65b is opposed to the opposed portion 62d. A gap portion $GP2_2$ is formed between the opposed portion 65b and the opposed portion 62d (cf. FIG. 13). When the voltage not less than the predetermined value is applied between the external electrode 42 and the external electrode 46, the electric discharge occurs in the gap portion $GP2_2$ between the first discharge electrode 65 and the second discharge electrode 62. The width of the gap portion $GP2_2$ is set at a predetermined value so as to achieve a desired discharge characteristic.

The discharge inducing portion 13 is in contact with the first discharge electrode 65 and the second discharge electrode 62 so as to connect the opposed portion 65b of the first discharge electrode 65 and the opposed portion 62*d* of the second discharge electrode 62 to each other. Namely, the discharge inducing portion 13 is formed so as to connect the mutually opposed portions of the first and second discharge electrodes 65, 62 to each other and has a function to facilitate occurrence of the electric discharge between the first discharge electrode 65 and the second discharge electrode 62.

The element body 4 has the cavity portion 14 (cf. FIG. 13) at the position of the second ESD suppressor $SP2_2$. Surfaces defining the cavity portion 14 include surfaces 13*a* of the first and second discharge electrodes 65, 62 (the opposed portions 65*b*, 62*d*) and the discharge inducing portion 13 (the portions exposed from the opposed portions 65*b*, 62*d*), and a surface 14*b* opposed to the surfaces 13*a*. The cavity portion 14 is located so as to cover the whole of the discharge inducing portion 13 when viewed from the stack direction. The cavity portion 14 is in contact with the opposed portions 65*b*, 62*d* and with the discharge inducing portion 13 (the portions exposed from the opposed portions 65*b*, 62*d*). The cavity portion 14 has a function to absorb thermal expansion of the first discharge electrode 65, the second discharge electrode 62, the insulator layers 10, and the discharge inducing portion 13 during the electric discharge.

The third ESD suppressor $SP2_3$ is provided with a first discharge electrode 68 and a second discharge electrode 69 and with the discharge inducing portion 13. The first discharge electrode 68 and the second discharge electrode 69 are arranged on the same insulator layer 10 while being separated from each other. The discharge inducing portion 13 connects the first discharge electrode 68 and the second discharge electrode 69.

The first discharge electrode 68 has a lead portion 68*a* and an opposed portion 68*b*. The lead portion 68*a* extends in the transverse direction of the insulator layers 10. The opposed portion 68*b* extends in the longitudinal direction of the insulator layers 10. The lead portion 68*a* and the opposed portion 68*b* are integrally formed. The first discharge electrode 68 has an L-shape. The lead portion 68*a* is exposed in the side surface 4*f* and is connected to the external electrode 45. Namely, the first discharge electrode 68 is electrically connected through the external electrode 45 to the other end $E2_2$ of the first coil $L2_1$. The opposed portion 68*b* is opposed to the second discharge electrode 69.

The second discharge electrode 69 extends in the longitudinal direction of the insulator layers 10. The second discharge electrode 69 has a lead portion 69*a* and an opposed portion 69*b*. The lead portion 69*a* is exposed in the end surface 4*a* and connected to the external electrode 41. The opposed portion 69*b* is opposed to the opposed portion 68*b* of the first discharge electrode 68 in the transverse direction of the insulator layers 10.

The first discharge electrode 68 and the second discharge electrode 69 are arranged as separated from each other so that the opposed portion 68*b* is opposed to the opposed portion 69*b*. A gap portion $GP2_3$ is formed between the opposed portion 68*b* and the opposed portion 69*b* (cf. FIG. 12). When the voltage not less than the predetermined value is applied between the external electrode 41 and the external electrode 45, the electric discharge occurs in the gap portion $GP2_3$ between the first discharge electrode 68 and the second discharge electrode 69. The width of the gap portion $GP2_3$ is set at a predetermined value so as to achieve a desired discharge characteristic.

The discharge inducing portion 13 is in contact with the first discharge electrode 68 and the second discharge electrode 69 so as to connect the opposed portion 68*b* of the first discharge electrode 68 and the opposed portion 69*b* of the second discharge electrode 69. Namely, the discharge inducing portion 13 is formed so as to connect the mutually opposed portions of the first and second discharge electrodes 68, 69 to each other and has a function to facilitate occurrence of the electric discharge between the first discharge electrode 68 and the second discharge electrode 69.

The element body 4 has the cavity portion 14 (cf. FIGS. 12 and 14) at the position of the third ESD suppressor $SP2_3$. Surfaces defining the cavity portion 14 include surfaces 13*a* of the first and second discharge electrodes 68, 69 (the opposed portions 68*b*, 69*b*) and the discharge inducing portion 13 (the portions exposed from the opposed portions 68*b*, 69*b*), and a surface 14*b* opposed to the surfaces 13*a*. The cavity portion 14 is located so as to cover the whole of the discharge inducing portion 13 when viewed from the stack direction. The cavity portion 14 is in contact with the opposed portions 68*b*, 69*b* and with the discharge inducing portion 13 (the portions exposed from the opposed portions 68*b*, 69*b*). The cavity portion 14 has a function to absorb thermal expansion of the first discharge electrode 68, the second discharge electrode 69, the insulator layers 10, and the discharge inducing portion 13 during the electric discharge.

The fourth ESD suppressor $SP2_4$ is provided with a first discharge electrode 72 and the second discharge electrode 69 and with the discharge inducing portion 13. The first discharge electrode 72 and the second discharge electrode 69 are arranged on the same insulator layer 10 while being separated from each other. The discharge inducing portion 13 connects the first discharge electrode 72 and the second discharge electrode 69.

The first discharge electrode 72 has a lead portion 72*a* and an opposed portion 72*b*. The lead portion 72*a* extends in the transverse direction of the insulator layers 10. The opposed portion 72*b* extends in the longitudinal direction of the insulator layers 10. The lead portion 72*a* and the opposed portion 72*b* are integrally formed. The first discharge electrode 72 has an L-shape. The lead portion 72*a* is exposed in the side surface 4*e* and is connected to the external electrode 44. Namely, the first discharge electrode 72 is electrically connected through the external electrode 44 to one end $E2_3$ of the second coil $L2_2$. The opposed portion 72*b* is opposed to the second discharge electrode 69.

The second discharge electrode 69 has a lead portion 69*c* and an opposed portion 69*d*. The lead portion 69*c* is exposed in the end surface 4*b* and connected to the external electrode 42. The opposed portion 69*d* is opposed to the opposed portion 72*b* of the first discharge electrode 72 in the transverse direction of the insulator layers 10. The lead portions 69*a*, 69*c* and the opposed portions 69*b*, 69*d* are integrally formed.

The first discharge electrode 72 and the second discharge electrode 69 are arranged as separated from each other so that the opposed portion 72*b* is opposed to the opposed portion 69*d*. A gap portion $GP2_4$ is formed between the opposed portion 72*b* and the opposed portion 69*d* (cf. FIG. 13). When the voltage not less than the predetermined value is applied between the external electrode 42 and the external electrode 44, the electric discharge occurs in the gap portion $GP2_4$ between the first discharge electrode 72 and the second discharge electrode 69. The width of the gap portion $GP2_4$ is set at a predetermined value so as to achieve a desired discharge characteristic.

The discharge inducing portion 13 is in contact with the first discharge electrode 72 and the second discharge electrode 69 so as to connect the opposed portion 72*b* of the first discharge electrode 72 and the opposed portion 69d of the second discharge electrode 69 to each other. Namely, the discharge inducing portion 13 is formed so as to connect the mutually opposed portions of the first and second discharge electrodes 72, 69 to each other and has a function to facilitate occurrence of the electric discharge between the first discharge electrode 72 and the second discharge electrode 69.

The element body 4 has the cavity portion 14 (cf. FIG. 13) at the position of the fourth ESD suppressor SP2$_4$. Surfaces defining the cavity portion 14 include surfaces 13a of the first and second discharge electrodes 72, 69 (the opposed portions 72b, 69d) and the discharge inducing portion 13 (the portions exposed from the opposed portions 72b, 69d), and a surface 14b opposed to the surfaces 13a. The cavity portion 14 is located so as to cover the whole of the discharge inducing portion 13 when viewed from the stack direction. The cavity portion 14 is in contact with the opposed portions 72b, 69d and with the discharge inducing portion 13 (the portions exposed from the opposed portions 72b, 69d). The cavity portion 14 has a function to absorb thermal expansion of the first discharge electrode 72, the second discharge electrode 69, the insulator layers 10, and the discharge inducing portion 13 during the electric discharge.

In the second embodiment as well, the discharge inducing portion 13 has the metal particles, the glass-containing ceramic material, and the dielectric material having the dielectric constant higher than that of the ceramic material. The content of the dielectric material is in the range of 7.5 to 40% by volume, with respect to the total volume of the ceramic material and the dielectric material. Therefore, the discharge start voltage of the ESD protection component EP2 can be set at a lower level.

Third Embodiment

Figure 15:
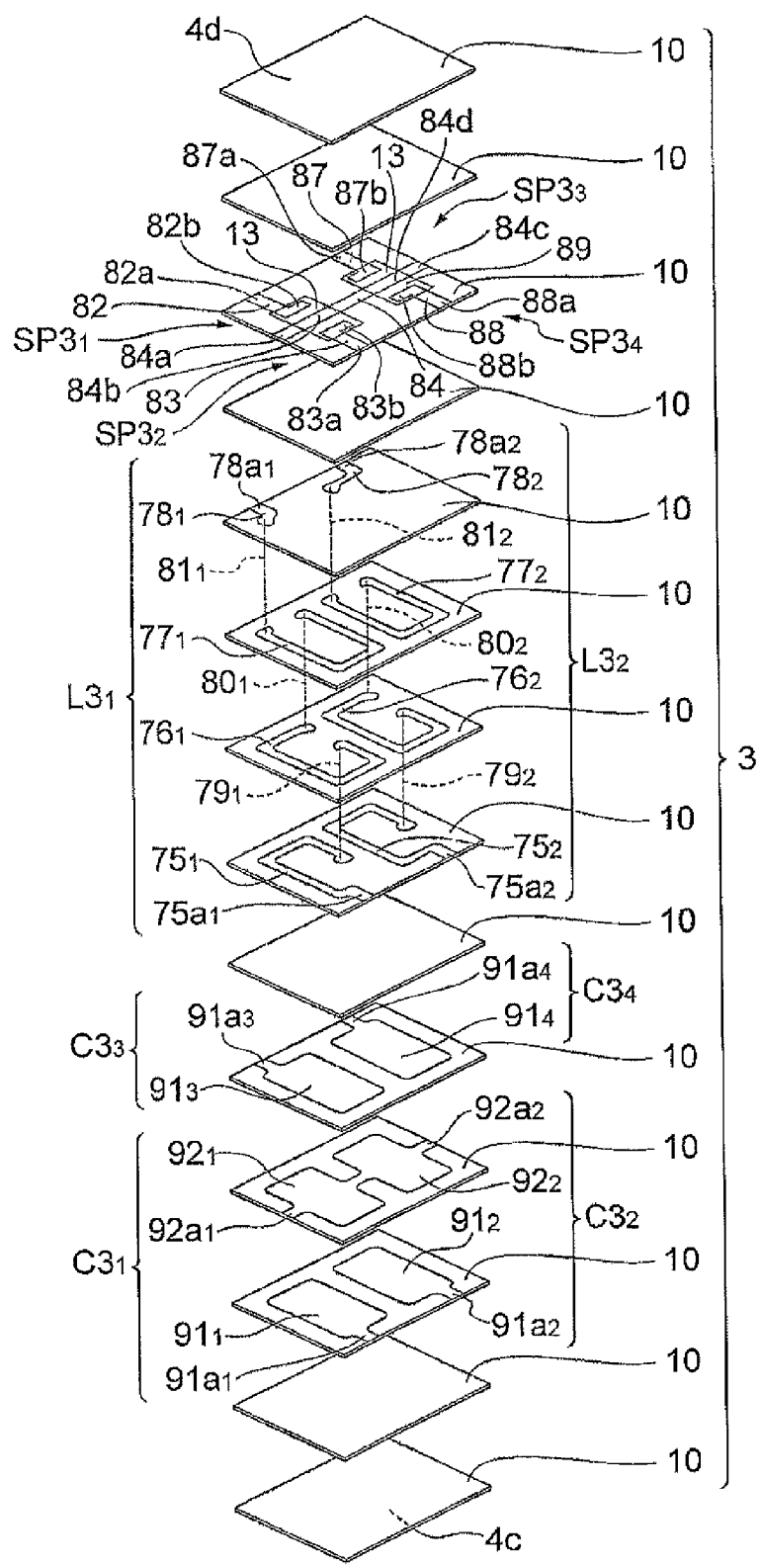
FIG. 15 is an exploded perspective view showing a configuration of an element body according to the third embodiment.
Figure 16:
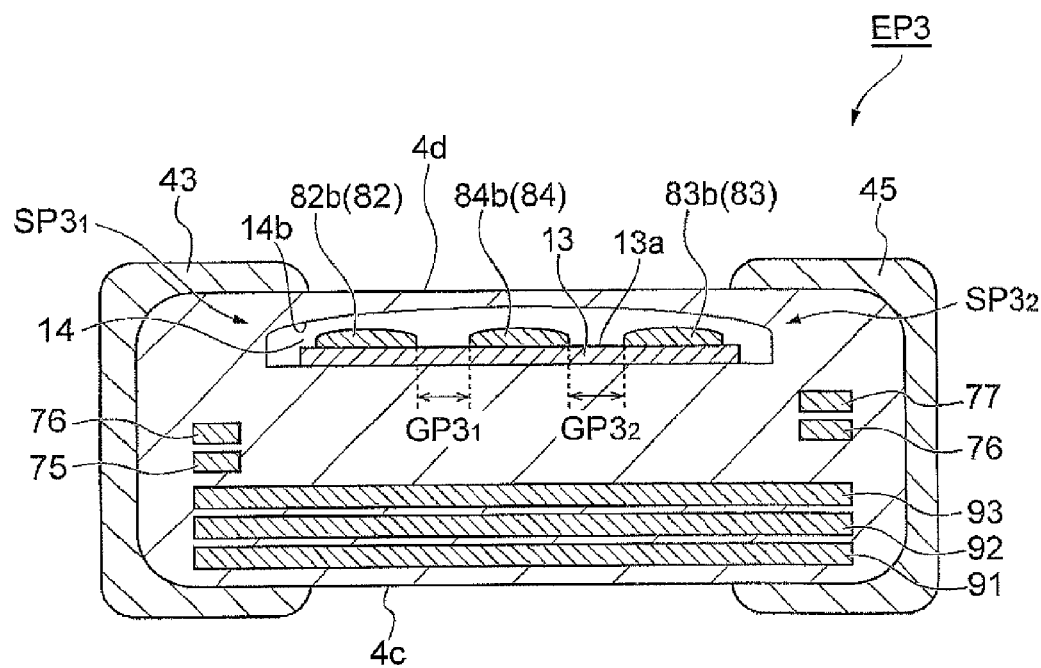
FIG. 16 is a drawing showing a cross-sectional configuration including a first ESD suppressor and a second ESD suppressor, of the ESD protection component according to the third embodiment.
Figure 17:
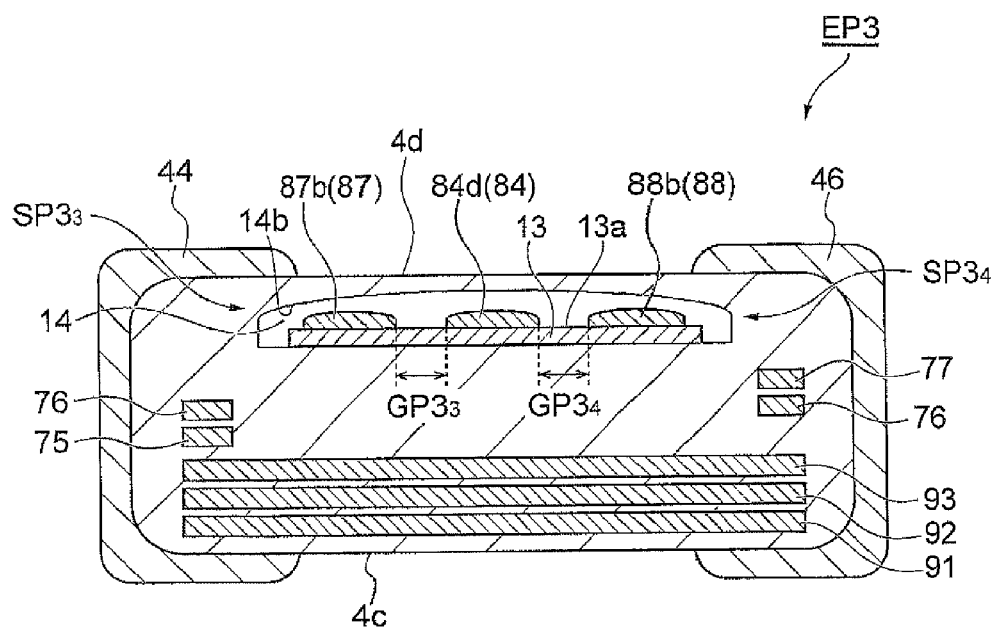
FIG. 17 is a drawing showing a cross-sectional configuration including a third ESD suppressor and a fourth ESD suppressor, of the ESD protection component according to the third embodiment.
Figure 18:
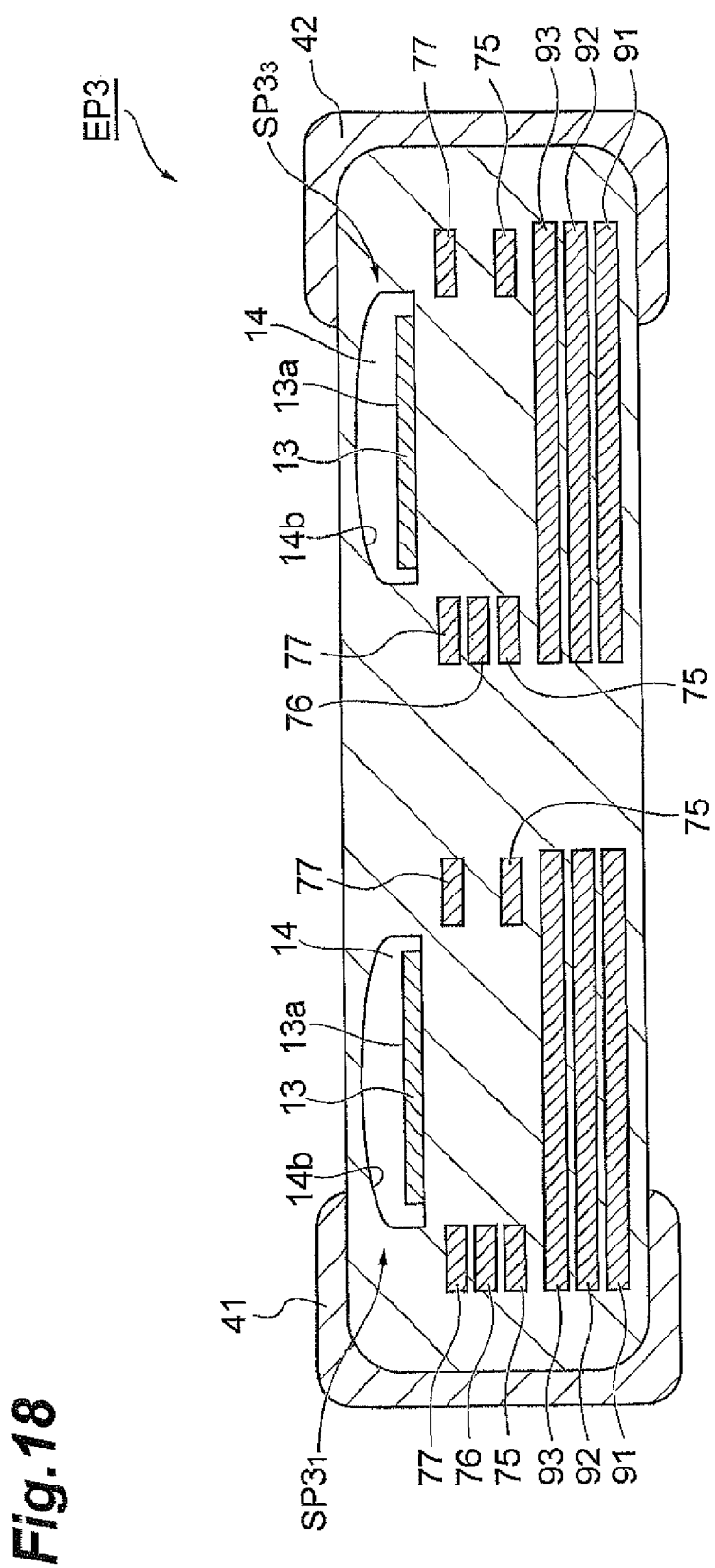
FIG. 18 is a drawing showing a cross-sectional configuration including the first ESD suppressor and the third ESD suppressor, of the ESD protection component according to the third embodiment.

Next, a configuration of an ESD protection component EP3 according to the third embodiment will be described with reference to FIGS. 10 and 15 to 18. FIG. 15 is an exploded perspective view showing a configuration of an element body which the ESD protection component according to the third embodiment has. FIG. 16 is a drawing showing a cross-sectional configuration including a first ESD suppressor and a second ESD suppressor, of the ESD protection component according to the third embodiment. FIG. 17 is a drawing showing a cross-sectional configuration including a third ESD suppressor and a fourth ESD suppressor, of the ESD protection component according to the third embodiment. FIG. 18 is a drawing showing a cross-sectional configuration including the first ESD suppressor and the third ESD suppressor, of the ESD protection component according to the third embodiment.

The ESD protection component EP3, as shown in FIGS. 10 and 15 to 18, is provided with the element body 4 and with a plurality of external electrodes 41 to 46 arranged on the exterior surface of the element body 4. The ESD protection component EP3 is further provided with a first coil L3$_1$ and a second coil L3$_2$, with a first ESD suppressor SP3$_1$, a second ESD suppressor SP3$_2$, a third ESD suppressor SP3$_3$, and a fourth ESD suppressor SP3$_4$, and with a first capacitor C3$_1$, a second capacitor C3$_2$, a third capacitor C3$_3$, and a fourth capacitor C3$_4$. The first and second coils L3$_1$, L3$_2$, the first to fourth suppressors SP3$_1$ to SP3$_4$, and the first to fourth capacitors C3$_1$ to C3$_4$ are arranged inside the element body 4. The first to fourth suppressors SP3$_1$ to SP3$_4$ have the ESD absorption capability.

The first coil L3$_1$ and the second coil L3$_2$ are arranged between the first to fourth ESD suppressors SP3$_1$ to SP3$_4$ and the first to fourth capacitors C3$_1$ to C3$_4$ in the stack direction of the insulator layers 10.

The first coil L3$_1$ is constructed by connecting ends of conductors 75$_1$ to 78$_1$ to each other by respective through-hole conductors 79$_1$-81$_1$ located between the conductors 75$_1$ to 78$_1$. The conductors 75$_1$ to 78$_1$ are juxtaposed in the stack direction of the insulator layers 10 inside the element body 4. The conductors 75$_1$-78$_1$ are located in an order of the conductor 75$_1$, the conductor 76$_1$, the conductor 77$_1$, and the conductor 78$_1$ named from the side nearer to the side surface 4c of the element body 4, in the stack direction of the insulator layers 10.

The through-hole conductor 79$_1$ is located between the conductor 75$_1$ and the conductor 76$_1$ and electrically connects the conductor 75$_1$ and the conductor 76$_1$. The through-hole conductor 80$_1$ is located between the conductor 76$_1$ and the conductor 77$_1$ and electrically connects the conductor 76$_1$ and the conductor 77$_1$. The through-hole conductor 81$_1$ is located between the conductor 77$_1$ and the conductor 78$_1$ and electrically connects the conductor 77$_1$ and the conductor 78$_1$. Each of the through-hole conductors 79$_1$-81$_1$ functions as a part of the first coil L3$_1$.

An end 78a$_1$ of the conductor 78$_1$ is exposed in the side surface 4e of the element body 4 and connected to the external electrode 43. An end 75a$_1$ of the conductor 75$_1$ is exposed in the side surface 4f of the element body 4 and connected to the external electrode 45. The end 78a$_1$ of the conductor 78$_1$ corresponds to one end E3$_1$ of the first coil L3$_1$ and the end 75a$_1$ of the conductor 75$_1$ corresponds to the other end E3$_2$ of the first coil L3$_1$. The first coil L3$_1$ is electrically connected to each of the external electrodes 43, 45.

The second coil L3$_2$ is constructed by connecting ends of conductor 75$_2$ to 78$_2$ to each other by respective through-hole conductors 79$_2$-81$_2$ located between the conductors 75$_2$ to 78$_2$. The conductors 75$_2$-78$_2$ are juxtaposed in the stack direction of the insulator layers 10 inside the element body 4. Each conductor 75$_2$-78$_2$ is arranged on the same insulator layer 10 as each conductor 75$_1$-78$_2$, respectively, is. The conductors 75$_2$-78$_2$ are located in an order of the conductor 75$_2$, the conductor 76$_2$, the conductor 77$_2$, and the conductor 78$_2$ from the side nearer to the side surface 4c of the element body 4, in the stack direction of the insulator layers 10.

The through-hole conductor 79$_2$ is located between the conductor 75$_2$ and the conductor 76$_2$ and electrically connects the conductor 75$_2$ and the conductor 76$_2$. The through-hole conductor 80$_2$ is located between the conductor 76$_2$ and the conductor 77$_2$ and electrically connects the conductor 76$_2$ and the conductor 77$_2$. The through-hole conductor 81$_2$ is located between the conductor 77$_2$ and the conductor 78$_2$ and electrically connects the conductor 77$_2$ and the conductor 78$_2$. Each of the through-hole conductors 79$_2$-81$_2$ functions as a part of the second coil L3$_2$.

An end 78a$_2$ of the conductor 78$_2$ is exposed in the side surface 4e of the element body 4 and connected to the external electrode 44. An end 75a$_2$ of the conductor 75$_2$ is exposed in the side surface 4f of the element body 4 and connected to the external electrode 46. The end 78a$_2$ of the conductor 78$_2$ corresponds to one end E3$_3$ of the second coil L3$_2$ and the end 75a$_2$ of the conductor 75$_2$ corresponds to the other end E3$_4$ of the second coil L3$_2$. The second coil L3$_2$ is electrically connected to each of the external electrodes 44, 46.

The first ESD suppressor SP3$_1$, the second ESD suppressor SP3$_2$, the third ESD suppressor SP3$_3$, and the fourth ESD suppressor SP3₄ are arranged on the same layer. The first to fourth ESD suppressors SP3₁-SP3₄ are nearer to the side surface 4d than the first and second coils L3₁, L3₂, in the stack direction of the insulator layers 10.

The first ESD suppressor SP3₁ is provided with a first discharge electrode 82 and a second discharge electrode 84 and with the discharge inducing portion 13. The first discharge electrode 82 and the second discharge electrode 84 are arranged on the same insulator layer 10 while being separated from each other. The discharge inducing portion 13 connects the first discharge electrode 82 and the second discharge electrode 84. The second ESD suppressor SP3₂ is provided with a first discharge electrode 83 and the second discharge electrode 84 and with the discharge inducing portion 13. The first discharge electrode 83 and the second discharge electrode 84 are arranged on the same insulator layer 10 while being separated from each other. The discharge inducing portion 13 connects the first discharge electrode 83 and the second discharge electrode 84.

The first discharge electrode 82 has a lead portion 82a and an opposed portion 82b. The lead portion 82a extends in the transverse direction of the insulator layers 10. The opposed portion 82b extends in the longitudinal direction of the insulator layers 10. The lead portion 82a and the opposed portion 82b are integrally formed. The first discharge electrode 82 has an L-shape. The lead portion 82a is exposed in the side surface 4e and is connected to the external electrode 43. Namely, the first discharge electrode 82 is electrically connected through the external electrode 43 to the one end of the first coil L3₁. The opposed portion 82b is opposed to the second discharge electrode 84.

The first discharge electrode 83 has a lead portion 83a and an opposed portion 83b. The lead portion 83a extends in the transverse direction of the insulator layers 10. The opposed portion 83b extends in the longitudinal direction of the insulator layers 10. The lead portion 83a and the opposed portion 83b are integrally formed. The first discharge electrode 83 has an L-shape. The lead portion 83a is exposed in the side surface 4f and is connected to the external electrode 45. Namely, the first discharge electrode 83 is electrically connected through the external electrode 45 to the other end of the first coil L3₁. The opposed portion 83b is opposed to the second discharge electrode 84.

The second discharge electrode 84 extends in the longitudinal direction of the insulator layers 10. The second discharge electrode 84 has a lead portion 84a and an opposed portion 84b. The lead portion 84a is exposed in the end surface 4a and connected to the external electrode 41. The opposed portion 84b is opposed to the opposed portions 82b, 83b of the first discharge electrodes 82, 83 in the transverse direction of the insulator layers 10.

The first discharge electrode 82 and the second discharge electrode 84 are arranged as separated from each other so that the opposed portion 82b is opposed to the opposed portion 84b. A gap portion GP3₁ is formed between the opposed portion 82b and the opposed portion 84b (cf. FIG. 16). When the voltage not less than the predetermined value is applied between the external electrode 41 and the external electrode 43, the electric discharge occurs in the gap portion GP3₁ between the first discharge electrode 82 and the second discharge electrode 84. The width of the gap portion GP3₁ is set at a predetermined value so as to achieve a desired discharge characteristic.

The first discharge electrode 83 and the second discharge electrode 84 are arranged as separated from each other so that the opposed portion 83b is opposed to the opposed portion 84b. A gap portion GP3₂ is formed between the opposed portion 83b and the opposed portion 84b (cf. FIG. 16). When the voltage not less than the predetermined value is applied between the external electrode 41 and the external electrode 45, the electric discharge occurs in the gap portion GP3₂ between the first discharge electrode 83 and the second discharge electrode 84. The width of the gap portion GP3₂ is set at a predetermined value so as to achieve a desired discharge characteristic.

The discharge inducing portion 13 is in contact with the first discharge electrodes 82, 83 and the second discharge electrode 84 so as to connect the opposed portions 82b, 83b of the first discharge electrodes 82, 83 and the opposed portion 84b of the second discharge electrode 84 to each other. Namely, the discharge inducing portion 13 is formed so as to connect the mutually opposed portions of the first and second discharge electrodes 82, 83, 84 to each other and has a function to facilitate occurrence of the electric discharge between the first discharge electrodes 82, 83 and the second discharge electrode 84.

The element body 4 has the cavity portion 14 (cf. FIGS. 16 and 18) at the position of the first and second ESD suppressors SP3₁, SP3₂. Surfaces defining the cavity portion 14 include surfaces 13a of the first and second discharge electrodes 82, 83, 84 (the opposed portions 82b, 83b, 84b) and the discharge inducing portion 13 (the portions exposed from the opposed portions 82b, 83b, 84b), and a surface 14b opposed to the surfaces 13a. The cavity portion 14 is located so as to cover the whole of the discharge inducing portion 13 when viewed from the stack direction. The cavity portion 14 is in contact with the opposed portions 82b, 83b, 84b and with the discharge inducing portion 13 (the portions exposed from the opposed portions 82b, 83b, 84b). The cavity portion 14 has a function to absorb thermal expansion of the first discharge electrodes 82, 83, the second discharge electrode 84, the insulator layers 10, and the discharge inducing portion 13 during the electric discharge.

The third ESD suppressor SP3₃ is provided with a first discharge electrode 87 and the second discharge electrode 84 and with the discharge inducing portion 13. The first discharge electrode 87 and the second discharge electrode 84 are arranged on the same insulator layer 10 while being separated from each other. The discharge inducing portion 13 connects the first discharge electrode 87 and the second discharge electrode 84. The fourth ESD suppressor SP3₄ is provided with a first discharge electrode 88 and the second discharge electrode 84 and with the discharge inducing portion 13. The first discharge electrode 88 and the second discharge electrode 84 are arranged on the same insulator layer 10 while being separated from each other. The discharge inducing portion 13 connects the first discharge electrode 88 and the second discharge electrode 84.

The first discharge electrode 87 has a lead portion 87a and an opposed portion 87b. The lead portion 87a extends in the transverse direction of the insulator layers 10. The opposed portion 87b extends in the longitudinal direction of the insulator layers 10. The lead portion 87a and the opposed portion 87b are integrally formed. The first discharge electrode 87 has an L-shape. The lead portion 87a is exposed in the side surface 4e and is connected to the external electrode 44. Namely, the first discharge electrode 87 is electrically connected through the external electrode 44 to the one end of the second coil L3₂. The opposed portion 87b is opposed to the second discharge electrode 84.

The first discharge electrode 88 has a lead portion 88a and an opposed portion 88b. The lead portion 88a extends in the transverse direction of the insulator layers 10. The opposed portion 88b extends in the longitudinal direction of the insulator layers 10. The lead portion 88a and the opposed portion 88b are integrally formed. The first discharge electrode 88 has an L-shape. The lead portion 88a is exposed in the side surface 4f and is connected to the external electrode 46. Namely, the first discharge electrode 88 is electrically connected through the external electrode 46 to the other end of the second coil L3$_2$. The opposed portion 88b is opposed to the second discharge electrode 84.

The second discharge electrode 84 extends in the longitudinal direction of the insulator layers 10. The second discharge electrode 84 has a lead portion 84c and an opposed portion 84d. The lead portion 84c is exposed in the end surface 4b and connected to the external electrode 42. The opposed portion 84d is opposed to the opposed portions 87b, 88b of the first discharge electrodes 87, 88 in the transverse direction of the insulator layers 10.

The first discharge electrode 87 and the second discharge electrode 84 are arranged as separated from each other so that the opposed portion 87b is opposed to the opposed portion 84d. A gap portion GP3$_3$ is formed between the opposed portion 87b and the opposed portion 84d (cf. FIG. 17). When the voltage not less than the predetermined value is applied between the external electrode 42 and the external electrode 44, the electric discharge occurs in the gap portion GP3$_3$ between the first discharge electrode 87 and the second discharge electrode 84. The width of the gap portion GP3$_3$ is set at a predetermined value so as to achieve a desired discharge characteristic.

The first discharge electrode 88 and the second discharge electrode 84 are arranged as separated from each other so that the opposed portion 88b is opposed to the opposed portion 84d. A gap portion GP3$_4$ is formed between the opposed portion 88b and the opposed portion 84d (cf. FIG. 17). When the voltage not less than the predetermined value is applied between the external electrode 42 and the external electrode 46, the electric discharge occurs in the gap portion GP3$_4$ between the first discharge electrode 88 and the second discharge electrode 84. The width of the gap portion GP3$_4$ is set at a predetermined value so as to achieve a desired discharge characteristic.

The discharge inducing portion 13 is in contact with the first discharge electrodes 87, 88 and the second discharge electrode 84 so as to connect the opposed portions 87b, 88b of the first discharge electrodes 87, 88 and the opposed portion 84d of the second discharge electrode 84 to each other. Namely, the discharge inducing portion 13 is formed so as to connect the mutually opposed portions of the first and second discharge electrodes 87, 88, 84 to each other and has a function to facilitate occurrence of the electric discharge between the first discharge electrodes 87, 88 and the second discharge electrode 84.

The element body 4 has the cavity portion 14 (cf. FIGS. 17 and 18) at the position of the third and fourth ESD suppressors SP3$_3$, SP3$_4$. Surfaces defining the cavity portion 14 include surfaces 13a of the first and second discharge electrodes 87, 88, 84 (the opposed portions 87b, 88b, 84d) and the discharge inducing portion 13 (the portions exposed from the opposed portions 87b, 88b, 84d), and a surface 14b opposed to the surfaces 13a. The cavity portion 14 is located so as to cover the whole of the discharge inducing portion 13 when viewed from the stack direction. The cavity portion 14 is in contact with the opposed portions 87b, 88b, 84d and with the discharge inducing portion 13 (the portions exposed from the opposed portions 87b, 88b, 84d). The cavity portion 14 has a function to absorb thermal expansion of the first discharge electrodes 87, 88, the second discharge electrode 84, the insulator layers 10, and the discharge inducing portion 13 during the electric discharge.

In the third embodiment as well, the discharge inducing portion 13 has the metal particles, the glass-containing ceramic material, and the dielectric material having the dielectric constant higher than that of the ceramic material. The content of the dielectric material is in the range of 7.5 to 40% by volume, with respect to the total volume of the ceramic material and the dielectric material. Therefore, the discharge start voltage of the ESD protection component EP3 can be set at a lower level.

The above described the embodiments of the present invention but it should be noted that the present invention is not limited to the above embodiments and the present invention can be modified or applied to others without departing from the spirit and scope of the description in the claims.

The configurations of the first discharge electrode 11, 61, 65, 68, 72, 82, 83, 87, 88 and the second discharge electrode 12, 62, 69, 84 do not have to be limited to the configurations shown in FIGS. 2, 11, and 15, and they may be modified in shape, length, and width as occasion may demand.

The numbers of the ESD suppressors SP1, SP2$_1$-SP2$_4$, SP3$_1$-SP3$_4$ of the ESD protection components EP1, EP2, EP3 are not limited to the numbers shown in FIGS. 2, 11, and 15, either, and the numbers of ESD suppressors SP1, SP2$_1$-SP2$_4$, SP3$_1$-SP3$_4$ may be modified as occasion may demand.

The ESD protection component EP2 or EP3 is provided with the first to fourth ESD suppressors SP2$_1$-SP2$_4$; SP3$_1$-SP3$_4$ and with the coils (the first and second coils L2$_1$, L2$_2$; L3$_1$, L3$_2$) or the capacitors (the first to fourth capacitors C3$_1$-C3$_4$) as passive elements except for the first to fourth ESD suppressors SP2$_1$-SP2$_4$; SP3$_1$-SP3$_4$, but it may be provided with passive elements other than the coils or the capacitors.

What is claimed is:

1. An ESD protection component comprising:
   first and second discharge electrodes arranged so as to be opposed to each other through a gap; and
   a discharge inducing portion kept in contact with the first and second discharge electrodes and configured to connect the first and second discharge electrodes to each other,
   wherein the discharge inducing portion has metal particles, a ceramic material containing glass, and a dielectric material having a dielectric constant higher than that of the ceramic material, and
   wherein a content of the dielectric material is in the range of 7.5 to 40% by volume, with respect to a total volume of the ceramic material and the dielectric material.

2. The ESD protection component according to claim 1, wherein the metal particles are Pd particles.

3. The ESD protection component according to claim 1, wherein the dielectric material is zirconia.

* * * * *